United States Patent
Park et al.

(10) Patent No.: US 9,773,673 B2
(45) Date of Patent: Sep. 26, 2017

(54) COMPOSITION FOR MANUFACTURING SEMICONDUCTOR DEVICE AND METHOD OF MANUFACTURING SEMICONDUCTOR DEVICE USING THE COMPOSITION

(71) Applicant: Samsung Electronics Co., Ltd., Suwon-si, Gyeonggi-do (KR)

(72) Inventors: Jin Park, Yongin-si (KR); Hyun-woo Kim, Seongnam-si (KR); Myeong-koo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/148,622

(22) Filed: May 6, 2016

(65) Prior Publication Data
US 2017/0062217 A1   Mar. 2, 2017

(30) Foreign Application Priority Data

Aug. 24, 2015 (KR) .................. 10-2015-0118877

(51) Int. Cl.
| | | |
|---|---|---|
| *H01L 51/00* | (2006.01) | |
| *H01L 21/033* | (2006.01) | |
| *G03F 7/11* | (2006.01) | |
| *C09D 179/08* | (2006.01) | |
| *H01L 21/027* | (2006.01) | |

(52) U.S. Cl.
CPC ........ *H01L 21/0337* (2013.01); *C09D 179/08* (2013.01); *G03F 7/11* (2013.01); *H01L 21/0276* (2013.01); *H01L 21/0332* (2013.01)

(58) Field of Classification Search
CPC ............ H01L 21/0337; H01L 21/0271; H01L 21/31116; H01L 21/31144
USPC ......................................................... 257/40
See application file for complete search history.

(56) References Cited

U.S. PATENT DOCUMENTS

| | | |
|---|---|---|
| 7,772,358 B2 | 8/2010 | Tang et al. |
| 8,361,694 B2 | 1/2013 | Sakaguchi et al. |
| 8,513,133 B2 | 8/2013 | Minegishi et al. |
| 8,652,484 B2 | 2/2014 | McBride et al. |
| 8,709,701 B2 | 4/2014 | Sakaguchi et al. |
| 8,741,540 B2 | 6/2014 | Kim et al. |
| 8,883,516 B2 | 11/2014 | Manetto et al. |
| 8,883,611 B2 | 11/2014 | Lee et al. |
| 8,940,274 B2 | 1/2015 | Avory et al. |

(Continued)

OTHER PUBLICATIONS

Huisgen, Angewandte Chemie International Edition, Nov. 1963, pp. 633-645, vol. 2, No. 11, Agnew.Chem.Internat.Edit.

(Continued)

*Primary Examiner* — Anthony Ho
(74) *Attorney, Agent, or Firm* — Harness, Dickey & Pierce, P.L.C.

(57) ABSTRACT

A composition for manufacturing a semiconductor device includes at least one carbon-based compound that includes at least one of an alkyne group and an azide group, and a solvent. A method of manufacturing a semiconductor device includes forming a feature layer on a substrate, coating the feature layer with a composition including alkyne and azide, forming a carbon-containing layer including a triazole compound by performing a heat treatment on the coated composition, forming a photoresist film on the carbon-containing layer, forming photoresist patterns by exposing and developing the photoresist film, and patterning the carbon-containing layer and the feature layer using the photoresist patterns.

20 Claims, 15 Drawing Sheets

(56) References Cited

U.S. PATENT DOCUMENTS

| | | |
|---|---|---|
| 8,951,988 B2 | 2/2015 | Zhou |
| 9,000,135 B2 | 4/2015 | Papot et al. |
| 9,006,106 B2 | 4/2015 | Kao et al. |
| 2013/0087529 A1 | 4/2013 | Hatakeyama et al. |
| 2013/0237686 A1 | 9/2013 | Chen et al. |
| 2013/0323642 A1 | 12/2013 | Bowman et al. |
| 2014/0302998 A1 | 10/2014 | Heath et al. |
| 2014/0335163 A1 | 11/2014 | Boivin et al. |
| 2014/0342273 A1 | 11/2014 | Kim et al. |
| 2014/0364594 A1 | 12/2014 | Hosoya et al. |
| 2015/0001178 A1 | 1/2015 | Song et al. |
| 2015/0008212 A1 | 1/2015 | Choi et al. |
| 2015/0037419 A1 | 2/2015 | Bazile et al. |
| 2015/0051392 A1 | 2/2015 | Donnelly et al. |
| 2015/0087790 A1 | 3/2015 | Harth et al. |
| 2015/0118832 A1 | 4/2015 | Wood et al. |
| 2015/0118844 A1 | 4/2015 | Sipani |
| 2015/0125892 A1 | 5/2015 | Van Delft et al. |

OTHER PUBLICATIONS

Huisgen, Angewandte Chemie International Edition, Oct. 1963, pp. 565-598,Vol. 2, No. 10, Agnew.Chem.Internat.Edit.

COMPOSITION FOR MANUFACTURING SEMICONDUCTOR DEVICE AND METHOD OF MANUFACTURING SEMICONDUCTOR DEVICE USING THE COMPOSITION

CROSS-REFERENCE TO RELATED APPLICATION

This application claims the benefit of priority from Korean Patent Application No. 10-2015-0118877, filed on Aug. 24, 2015, in the Korean Intellectual Property Office, the disclosure of which is incorporated herein in its entirety by reference.

BACKGROUND

The inventive concepts relate to a composition for manufacturing a semiconductor device and a method of manufacturing a semiconductor device using the composition, and/or to a composition for manufacturing a semiconductor device including an organic compound and a method of manufacturing a semiconductor device using the composition.

As a semiconductor device is highly integrated, patterns to be formed are miniaturized. Accordingly, when an existing lithography technology is used, it becomes more and more difficult to form fine patterns having a good profile. In this regard, various technologies have been proposed. In particular, in an etching process of forming the fine patterns, a hardmask layer that is formed through a spin coating process is introduced. As the hardmask layer is widely used in a method of manufacturing a highly integrated semiconductor device, requirements for a gap-fill property, a planarity property, and an etch resistance have become stricter. Therefore, there is a need to develop new materials for fully satisfying various properties required according to the development trend of the highly integrated semiconductor device and to develop a process technology using the new materials.

SUMMARY

The inventive concepts relate to a composition for manufacturing a semiconductor device, which is capable of providing an improved gap-fill property even on a lower structure having a stepped portion and an improved planarity property throughout a relatively wide region in a process of manufacturing a highly integrated semiconductor device.

The inventive concepts relate to a method of manufacturing a semiconductor device which is capable of efficiently forming desired patterns without causing undesired volume shrinkage and planarity degradation, even when high-density patterns having a relatively narrow width and a relatively dense pitch are formed, by securing an improved gap-fill property and planarity property on a carbon-containing layer formed on a lower structure having a stepped portion in a process of manufacturing a highly integrated semiconductor device.

According to an example embodiment, a composition for manufacturing a semiconductor device includes at least one carbon-based compound that includes at least one of an alkyne group and an azide group; and a solvent.

The at least one carbon-based compound may include at least one of a substituted or unsubstituted C1-C50 aliphatic hydrocarbon group, an aryl group including a substituted or unsubstituted C6-C50 aromatic hydrocarbon group, and an arylene group including a C6-C50 aromatic hydrocarbon group.

The at least one carbon-based compound may include a first compound including alkyne, and a second compound including azide.

The first compound may be expressed by the following Formula (1):

Formula (1)

wherein $R^1$ is a C1-C50 aliphatic hydrocarbon group or a C6-C50 aromatic hydrocarbon group, and $R^2$ is a hydrogen atom, a C1-C50 aliphatic hydrocarbon group, or a C6-C50 aromatic hydrocarbon group, and the second compound may be expressed by the following Formula (2):

Formula (2)

wherein $R^3$ is a C1-C50 aliphatic hydrocarbon group or a C6-C50 aromatic hydrocarbon group.

The at least one carbon-based compound may further include a third compound having a structure that is different from a structure of each or one of the first and second compounds. The third compound may not include alkyne and azide.

The at least one carbon-based compound may include a fourth compound including alkyne and azide.

The at least one carbon-based compound may include a fourth compound expressed by the following Formula (4):

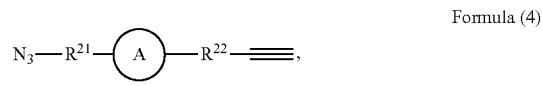
Formula (4)

wherein A is a carbon-based compound including at least one substituted or unsubstituted ring, $R^{21}$ and $R^{22}$ are substantially equal to or different from each other, and each of $R^{21}$ and $R^{22}$ independently includes at least one of a hydrogen atom, a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group.

"A" in Formula (4) may include a fused aliphatic ring, a fused aromatic ring, a fused heteroaliphatic ring, or a fused heteroaromatic ring.

The composition for manufacturing the semiconductor device may further include a surfactant.

According to another example embodiment, a method of manufacturing a semiconductor device includes forming a feature layer on a substrate; coating the feature layer with a composition including alkyne and azide; forming a carbon-containing layer including a triazole compound by performing a heat treatment on the coated composition; forming a photoresist film on the carbon-containing layer; forming photoresist patterns by exposing and developing the photoresist film; and patterning the carbon-containing layer and the feature layer using the photoresist patterns.

The patterning of the carbon-containing layer and the feature layer may include forming carbon-containing patterns by etching the carbon-containing layer using the photoresist patterns as an etching mask; and forming feature patterns by etching the feature layer using the carbon-containing patterns as an etching mask.

The forming of the photoresist patterns may include exposing the photoresist film using the carbon-containing layer as an anti-reflection film.

The forming of the carbon-containing layer may include inducing a cycloaddition reaction between the alkyne and the azide.

The inducing of the cycloaddition reaction may be performed without a catalyst.

The composition may include at least one carbon-based composition that includes at least one of a substituted or unsubstituted C1-C50 aliphatic hydrocarbon group, an aryl group including a substituted or unsubstituted C6-C50 aromatic hydrocarbon group, and an arylene group including a C6-C50 aromatic hydrocarbon group. The at least one carbon-based compound may include at least one heteroatom from nitrogen (N), oxygen (O), phosphorus (P), sulfur (S), boron (B), silicon (Si), a halogen atom, and a metal atom.

The at least one carbon-based compound may include: a first compound expressed by the following Formula (1):

$$R^1 \equiv R^2; \text{ and} \qquad \text{Formula (1)}$$

a second compound expressed by the following Formula (2):

$$N_3—R^3, \qquad \text{Formula (2)}$$

wherein $R^1$ is a C1-C50 aliphatic hydrocarbon group or a C6-C50 aromatic hydrocarbon group, $R^2$ is a hydrogen atom, a C1-C50 aliphatic hydrocarbon group, or a C6-C50 aromatic hydrocarbon group, and $R^3$ is a C1-C50 aliphatic hydrocarbon group or a C6-C50 aromatic hydrocarbon group.

The at least one carbon-based compound may further include a third compound that does not include alkyne and azide. The third compound may include at least one of substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, and a cyano group. The at least one carbon-based compound may include a fourth compound expressed by the following Formula (4):

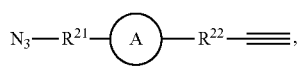 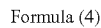

Formula (4)

wherein "A" is a carbon-based compound including at least one substituted or unsubstituted ring, $R^{21}$ and $R^{22}$ are substantially equal to or different from each other, and each of $R^{21}$ and $R^{22}$ independently includes at least one of a hydrogen atom, a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group.

Example embodiments include a method of manufacturing a semiconductor device, the method including coating a base layer with a cross-linking compound, heating the base layer and the cross-linking compound to form a semiconductor layer, the semiconductor layer not undergoing condensation, and the semiconductor layer having a thickness substantially equal to a single molecule of the cross-linking compound.

Example embodiments relate to a method of manufacturing a semiconductor device, the method including coating a base layer with a cross-linking compound, heating the base layer and the cross-linking compound to form a carbon-containing layer, the carbon-containing layer not undergoing condensation during or after the heating.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1:
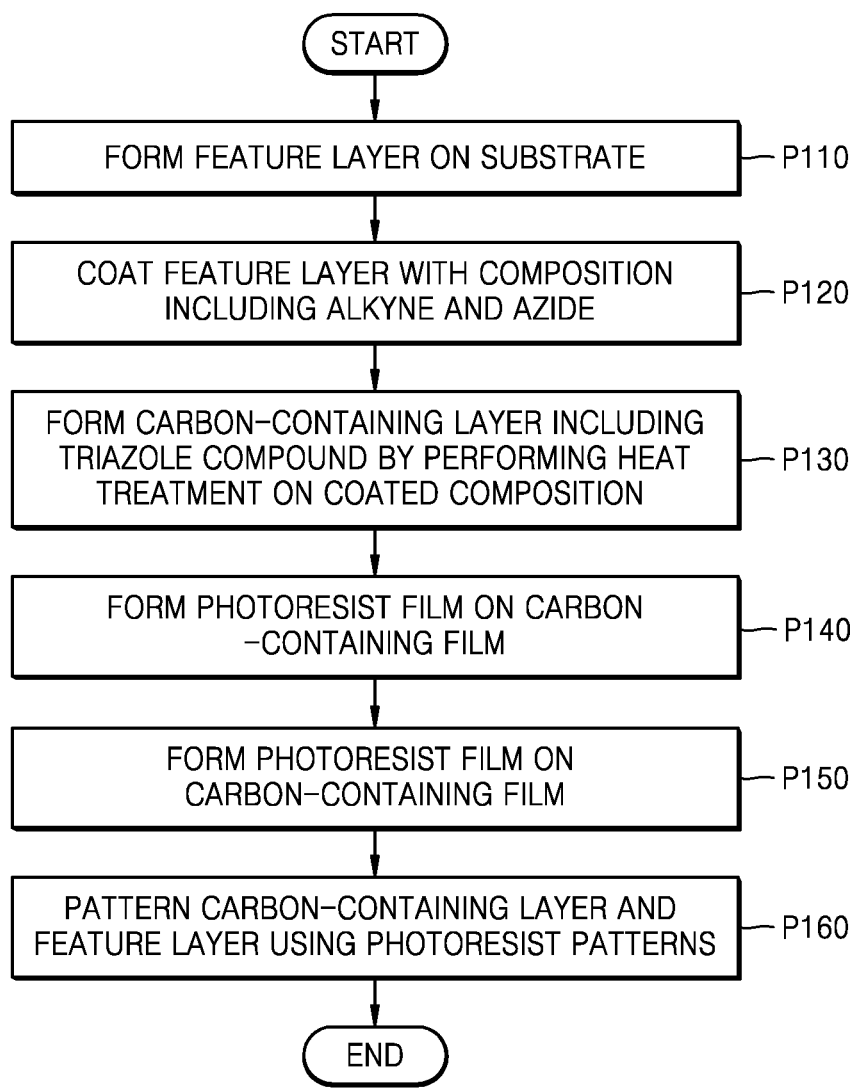
FIG. 1 is a flowchart of a method of manufacturing a semiconductor device, according to example embodiments.

Hereinafter, example embodiments will be described in detail with reference to the accompanying drawings. In the drawings, like reference numbers are used to refer to like elements and redundant descriptions thereof will be omitted.

Example embodiments may be embodied in many different forms and should not be construed as being as set forth herein; rather, these example embodiments are provided so that this disclosure will be thorough and complete, and will fully convey the inventive concepts to those of ordinary skill in the art. As used herein, the term "and/or" includes any and all combinations of one or more of the associated listed items. Expressions such as "at least one of" when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

Also, though terms "first", "second", etc. are used to describe various members, components, regions, layers, and/or portions in various example embodiments of the inventive concepts, the members, components, regions, layers, and/or portions are not limited to these terms. These terms do not mean a specific order, an up-and-down order, or superiority and are used only to differentiate one member, component, region, layer, or portion from another one. Therefore, a first member, a first component, a first region, a first layer, or a first portion in an embodiment may refer to a second member, a second component, a second region, a second layer, or a second portion in another embodiment. For example, a first element may be referred to as a second element without departing from the scope of the inventive concepts. Similarly, a second element may be referred to as a first element.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

In the accompanying drawings, the modifications of the illustrated shapes may be expected according to manufacturing technologies and/or tolerance. Therefore, the example embodiments should not be construed as being limited to specific shapes of the illustrated regions. The shapes may be changed during the manufacturing processes.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless defined differently, all terms used in the description including technical and scientific terms have the same meanings as generally understood by those skilled in the art. Terms commonly used and defined in dictionaries should be construed as having the same meanings as in the associated technical context of the inventive concepts, and unless defined apparently in the description, these terms are not ideally or excessively construed as having formal meanings. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along rectangulerent directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In this specification, the term "substituted" may mean that a hydrogen atom in a compound is substituted with a substituent from a halogen atom, a hydroxyl group, an alkoxy group, a nitro group, a cyano group, an amidino group, an azido group, an amidino group, a hydrazino group, a hydrazono group, a carbonyl group, a carbamyl group, a thiol group, an ester group, a carboxyl group, a carboxyl group salt, a sulfonic acid group, a sulfonic acid group salt, a phosphoric acid, a phosphate, a C1-C20 alkyl group, a C2-C20 alkenyl group, a C2-C20 alkynyl group, a C6-C30 aryl group, a C7-C30 arylalkyl group, a C1-C4 alkoxy group, a C1-C20 heteroalkyl group, a C3-C20 heteroarylalkyl group, a C3-C30 cycloalkyl group, a C3-C15 cycloalkenyl group, a C6-C15 cycloalkynyl group, a C2-C20 heterocycloalkyl group, and combinations thereof.

The term "C1-C20 alkyl group" may mean a straight chain or branched, substituted or unsubstituted alkyl group, which has about 1 to about 20 carbon atoms. Examples of the alkyl group may include at least one of methyl, ethyl, ethenyl, ethinyl, n-propyl, isopropyl, n-butyl, isobutyl, sec-butyl, t-butyl, butenyl, isobutenyl, butynyl, n-pentyl, n-hexyl, n-heptyl, and n-octyl, but are not limited thereto.

The term "C3-C30 cycloalkyl group" may mean an alkyl group that includes at least one of cyclohexyl, cyclopentyl, and cyclopropyl. The alkyl group may be a straight chain or branched alkyl group that has about 1 to about 6 carbon atoms.

The term "C7-C30 arylalkyl group" may mean substituted or unsubstituted C7-C30 aromatic hydrocarbon. Examples of the C7-C30 arylalkyl group may include at least one of phenyl, naphthyl, anthracenyl, phenanthrenyl, and fluorenyl, but are not limited thereto.

A composition for manufacturing a semiconductor device according to example embodiments may include a solvent and at least one carbon-based compound that includes at least one of an alkyne group and an azide group.

In some example embodiments, the at least one carbon-based compound, which is included in the composition for manufacturing the semiconductor device according to the example embodiments, may include at least one of a substituted or unsubstituted C1-C50 aliphatic hydrocarbon group, an aryl group including a substituted or unsubstituted C6-C50 aromatic hydrocarbon, and an arylene group including a C6-C50 aromatic hydrocarbon. For example, the at least one carbon-based compound may include at least one expressed by the Formulas below.

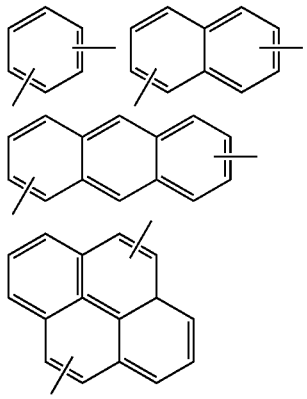

In some example embodiments, the at least one carbon-based compound, which is included in the composition for manufacturing the semiconductor device according to the example embodiments, may include at least one heteroatom from nitrogen (N), oxygen (O), phosphorus (P), sulfur (S), boron (B), silicon (Si), a halogen atom, and a metal atom. Examples of the metal atom that may be included in the at least one carbon-based compound may include at least one of titanium (Ti), zirconium (Zr), ruthenium (Ru), tungsten (W), and molybdenum (Mo), but are not limited thereto. The heteroatom may be included in an amount equal to or less than about 5 weight % with respect to a total weight of the carbon-based compound.

In some example embodiments, the at least one carbon-based compound, which is included in the composition for manufacturing the semiconductor device according to the example embodiments, may include a first compound including alkyne and a second compound including azide.

The first compound including alkyne may be expressed by the following Formula (1):

   Formula (1)

where $R^1$ is a C1-C50 aliphatic hydrocarbon group or a C6-C50 aromatic hydrocarbon group, and $R^2$ is a hydrogen atom, a C1-C50 aliphatic hydrocarbon group, or a C6-C50 aromatic hydrocarbon group.

The second compound including azide may be expressed by the following Formula (2):

   Formula (2)

where $R^3$ is a C1-C50 aliphatic hydrocarbon group or a C6-C50 aromatic hydrocarbon group.

The first compound and/or the second compound may include at least one heteroatom from N, O, P, S, B, Si, a halogen atom, and a metal atom. Examples of the metal atom that may be included in the first compound and/or the second compound may include at least one of Ti, Zr, Ru, W, and Mo, but are not limited thereto. The heteroatom may be included in an amount equal to or less than about 5 weight % with respect to a total weight of the carbon-based compound.

In some example embodiments, the first compound including alkyne may be expressed by the following Formula (1-1):

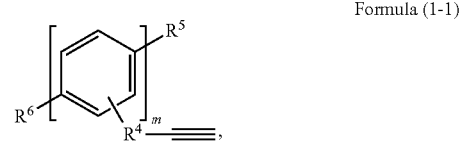   Formula (1-1)

where $R^4$ includes at least one of a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group, each of $R^5$ and $R^6$ independently includes a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group, a carboxyl group salt, a sulfonic acid group, a sulfonic acid group salt, a phosphoric acid, a phosphate, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring, and m is an integer from 1 to 10.

In some example embodiments, the second compound including azide may be expressed by the following Formula (2-1):

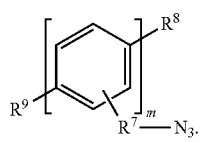

Formula (2-1)

where $R^7$ includes at least one of a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group, each of $R^8$ and $R^9$ independently includes a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group, a carboxyl group salt, a sulfonic acid group, a sulfonic acid group salt, a phosphoric acid, a phosphate, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring, and n is an integer from 1 to 10.

In an example, the first compound including alkyne may be expressed by following Formula (1-2):

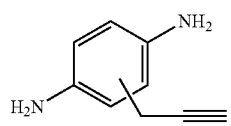

Formula (1-2)

In another example, the second compound including azide may be expressed by the following Formula (2-2):

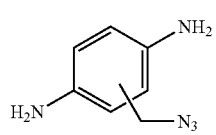

Formula (2-2)

In some example embodiments, the at least one carbon-based compound, which is included in the composition for manufacturing the semiconductor device according to the example embodiments, may include a third compound having a structure that is different from a structure of each of the first compound and the second compound. The third compound may include a carbon-based compound that is combinable with the first compound and the second compound through a reaction.

The third compound may not include alkyne and azide. In some example embodiments, the third compound may function as a linker between the first compound including alkyne and the second compound including azide.

In some example embodiments, the third compound may include at least one of substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, and a cyano group.

The third compound may include at least one heteroatom from N, O, P, S, B, Si, a halogen atom, and a metal atom. Examples of the metal atom capable of being included in the third compound may include at least one of Ti, Zr, Ru, W, and Mo, but are not limited thereto.

For example, the third compound may include one of a phenyl group, a pyridinyl group, a pyrrolyl group, a thiophenyl group, a furanyl group, a biphenyl group, an iptycenyl group, a tartrate ester group, an acetylene group, an alkene group, and combinations thereof, but is not limited thereto.

In some example embodiments, the third compound may be expressed by the following Formula (3):

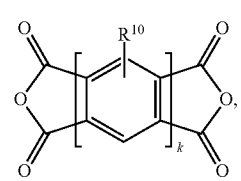

Formula (3)

where $R^{10}$ is a C1-C50 aliphatic hydrocarbon group or a C6-C50 aromatic hydrocarbon group, and k is an integer from 1 to 10.

In some example embodiments, the first compound including alkyne may be expressed by the following Formula (1-3):

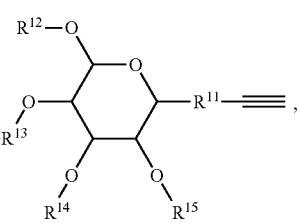

Formula (1-3)

where $R^{11}$ includes at least one of a substituted or unsubstituted C1-C20 alkyl group, a substituted or unsubstituted C1-C20 heteroalkyl group, a substituted or unsubstituted C2-C20 alkenyl group, a substituted or C2-C20 heteroalkenyl group, a substituted or unsubstituted C6-C30 aryl group, a substituted or unsubstituted C2-C30 heteroaryl group, a substituted or unsubstituted C2-C20 alkynyl group, and a substituted or unsubstituted C2-C20 heteroalkynyl group, and each of $R^{12}$, $R^{13}$, $R^{14}$, and $R^{15}$ independently includes at least one of a hydrogen atom substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

In some example embodiments, the second compound including azide may be expressed by the following Formula (2-3):

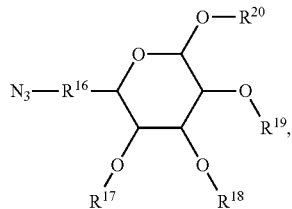

Formula (2-3)

where $R^{16}$ is a C1-C50 aliphatic hydrocarbon group or a C6-C50 aromatic hydrocarbon group, and each of $R^{17}$, $R^{18}$, $R^{19}$, and $R^{20}$ independently includes at least one of a hydrogen atom, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

In an example, the first compound including alkyne may be expressed by the following Formula (1-4):

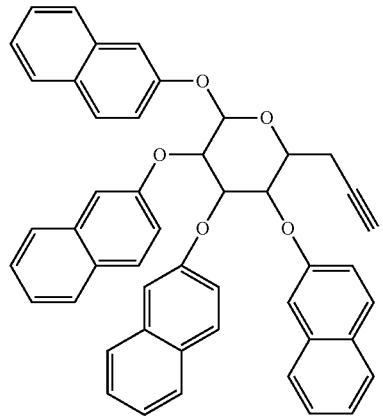

Formula (1-4)

In another example, the second compound including azide may be expressed by the following Formula (2-4):

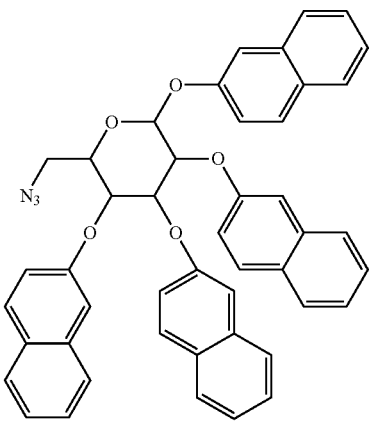

Formula (2-4)

In some example embodiments, the at least one carbon-based compound, which is included in the composition for manufacturing the semiconductor device according to the example embodiments, may include a fourth compound including alkyne and azide.

In some example embodiments, the fourth compound including alkyne and azide may be expressed by the following Formula (4):

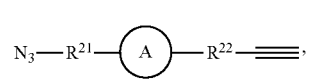

Formula (4)

where A is a carbon-based compound including at least one substituted or unsubstituted ring, $R^{21}$ and $R^{22}$ are substantially equal to or different from each other, and each of $R^{21}$ and $R^{22}$ independently includes at least one of a hydrogen atom, a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group.

In some example embodiments, "A" may include a fused aliphatic ring, a fused aromatic ring, a fused heteroaliphatic ring, or a fused heteroaromatic ring.

In some example embodiments, "A" may include at least one of substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, and a cyano group.

In some example embodiments, "A" may include at least one heteroatom from N, O, P, S, B, Si, a halogen atom, and a metal atom. Examples of the metal atom capable of being included in "A" may include at least one of Ti, Zr, Ru, W, and Mo, but are not limited thereto.

In some example embodiments, each of R21 and R22 in the fourth compound expressed by Formula (4) may independently include one of a methyl group, an ethyl group, a phenyl group, a pyridinyl group, a pyrrolyl group, a thiophenyl group, a furanyl group, a biphenyl group, an iptycenyl group, a tartrate ester group, acetylene, an alkene group, and combinations thereof.

In some example embodiments, the fourth compound including alkyne and azide may be expressed by the following Formula (4-1):

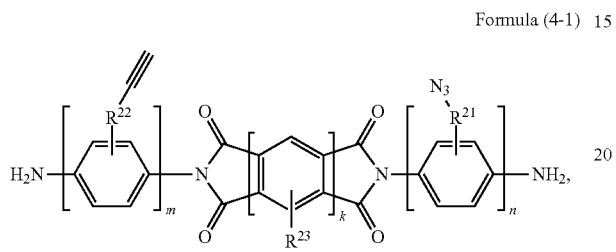

Formula (4-1)

where each of $R^{21}$ and $R^{22}$ independently includes one of a methyl group, an ethyl group, a phenyl group, a pyridinyl group, a pyrrolyl group, a thiophenyl group, a furanyl group, a biphenyl group, an iptycenyl group, a tartrate ester group, an acetylene group, an alkene group, and combinations thereof, $R^{23}$ includes at least one of a hydrogen atom, a C1-C50 aliphatic hydrocarbon group, and a C6-C50 aromatic hydrocarbon group, and each of k, m, and n is an integer from 1 to 10.

In some example embodiments, the fourth compound expressed by Formula (4-1) may be synthesized through a reaction between the first compound expressed by Formula (1-1), the second compound expressed by Formula (2-1), and the third compound expressed by Formula (3).

An example of the synthetic reaction of the fourth compound may be expressed by the following Reaction Formula 1:

where $R^4$, $R^7$, $R^{10}$, k, m, and n are substantially the same as defined above.

In some example embodiments, the fourth compound including alkyne and azide may be expressed by the following Formula (4-2):

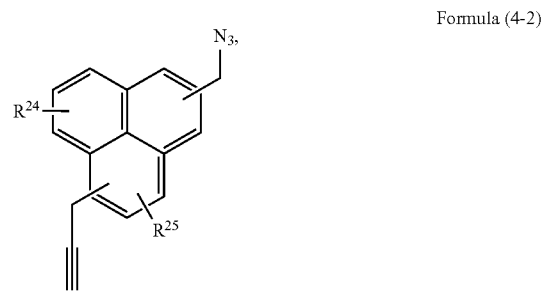

Formula (4-2)

where each of $R^{24}$ and $R^{25}$ independently includes at least one of a hydrogen atom, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

In some example embodiments, the fourth compound including alkyne and azide may be expressed by the following Formula (4-3):

[Reaction Formula 1]

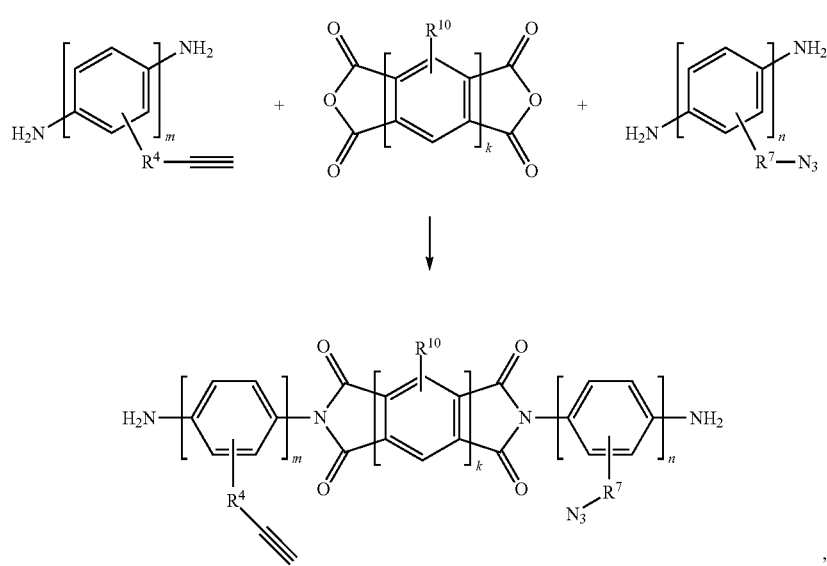

Formula (4-3)

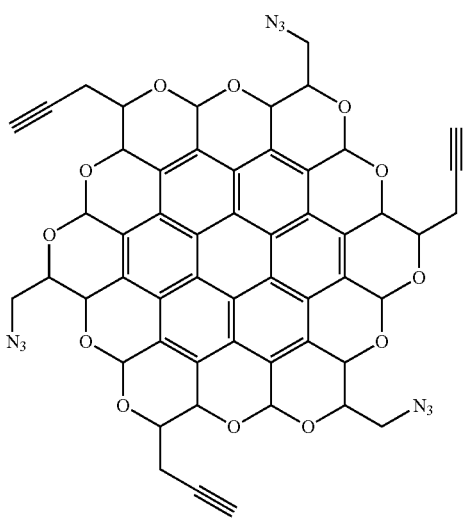

In some example embodiments, the at least one carbon-based compound, which is included in the composition for manufacturing the semiconductor device according to the example embodiments, may be included in an amount of about 5 weight % to about 30 weight % with respect to a total weight of the composition.

The solvent, which is included in the composition for manufacturing the semiconductor device according to the example embodiments, may include a material that has dissolubility or dispersibility with respect to the carbon-based compound.

In some example embodiments, the solvent may include one of deionized water (DIW), an organic solvent, an aqueous solvent, and combinations thereof. In some example embodiments, the solvent may include a mixture of DIW and an organic solvent.

In some example embodiments, the solvent may include one of DIW; alcohols such as methanol, ethanol, isopropanol, propanol, butanol, and terpineol; amides such as dimethylformamide (DMF) and dimethylacetamide; pyrrolidones such as N-methyl-2-pyrrolidone and N-ethylpyrrolidone; hydroxy esters such as dimethyl sulfoxide, γ-butyrolactone, lactic acid methyl, lactic acid ethyl, β-methoxyisobutyric acid methyl, and α-hydroxyisobutyric acid methyl; glycol derivatives such as propylene glycol, propylene glycol diacetate, diethylene glycol, diethylene glycol butyl ether, tri(ethylene glycol)monomethyl ether, propylene glycol monomethyl ether, and propylene glycol monomethyl ether acetate; organic halogen compounds such as dichloroethane, dichlorobenzene, and trichloroethane; nitro compounds such as nitromethane and nitroethane; nitrile compounds such as acetonitrile and benzonitrile; and combinations thereof.

According to the example embodiments, the composition for manufacturing the semiconductor device may further include a surfactant.

Examples of the surfactant may include at least one of an alkyl benzene sulfonic acid salt, an alkyl pyridinium salt, a polyethylene glycol, and a quaternary ammonium salt, but are not limited thereto. The surfactant may be included in an amount of about 0.1 weight % to about 0.3 weight % with respect to a total weight of the composition. The composition may include the surfactant, thereby improving the solubility of the carbon-based compound in the composition.

FIG. 1 is a flowchart of a method of manufacturing a semiconductor device, according to example embodiments.

Referring to FIG. 1, in process P110, a feature layer may be formed on a substrate.

The substrate may include a least one of a semiconductor element such as, for example, Si or Ge and a compound semiconductor material such as, for example, SiGe, SiC, GaAs, InAs, or InP. In some example embodiments, the substrate may include at least one of a Group III-V material and a Group IV material.

The feature layer may be a conductive layer or an insulating layer formed on a wafer. For example, the feature layer may include at least one of a metal, a semiconductor, and an insulating material. In some example embodiments, the feature layer may be a portion of the wafer.

In process P120, a composition including alkyne and azide may be coated on the feature layer.

The composition may include a solvent and a carbon-based compound including at least one of an alkyne group and an azide group. The composition may include at least one of the above-described compositions for manufacturing the semiconductor device according to the example embodiments.

The coating of the composition may be performed through, for example, a spin coating process.

In some example embodiments, the at least one carbon-based compound included in the composition may include the first compound including alkyne, as expressed by Formula (1), and the second compound including azide, as expressed by Formula (2). For example, the first compound including alkyne may include at least one of compounds that respectively have the structures of Formulas (1-1), (1-2), (1-3), and (1-4). The second compound including azide may include at least one of compounds that respectively have the structures of Formulas (2-1), (2-2), (2-3), and (2-4). The at least one carbon-based compound included in the composition may further include the third compound expressed by Formula (3) in addition to the first and second compounds.

In some example embodiments, the at least one carbon-based compound included in the composition may include the fourth compound including alkyne and azide, as expressed by Formula (4). For example, the fourth compound including alkyne and azide may include at least one of compounds that respectively have structures of Formulas (4-1), (4-2), (4-3), and (4-4).

In process P130, a carbon-containing layer including a triazole compound may be formed by performing a heat treatment on the composition coated on the feature layer.

In some example embodiments, the heat treatment may be performed at a temperature of about 100° C. to about 400° C., but the example embodiment is not limited thereto.

The triazole compound included in the carbon-containing layer may be expressed by at least one of the following Formulas (5-1) and (5-2):

Formula (5-1)

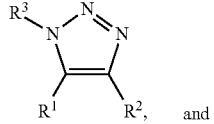

and

Formula (5-2)

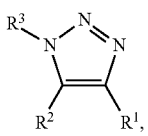

where $R^1$, $R^2$, and $R^3$ are substantially the same as defined above.

The triazole compound included in the carbon-containing layer may be a reaction product of alkyne and azide included in the composition described with reference to process P120. The carbon-containing layer may include a 1,2,3-triazole network system that includes a plurality of triazole compounds. In some example embodiments, as in the following Reaction Formula 2, a cycloaddition reaction (1,3-dipolar cycloaddition reaction or click reaction) between alkyne and azide may be induced so as to form the carbon-containing layer including the triazole compound.

[Reaction Formula 2]

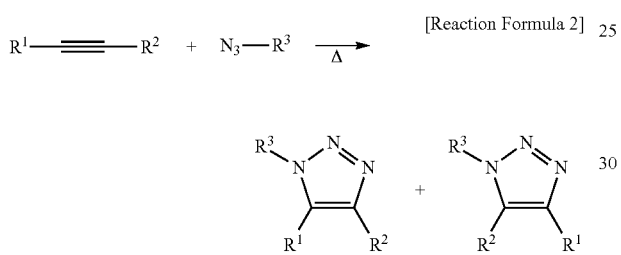

The cycloaddition reaction according to Reaction Formula 2 may be induced without a catalyst.

In some example embodiments, when the composition used in process P120 has the structure of Formula (4-1) including alkyne and azide, a heat treatment may be performed on the composition according to process P130 to induce a cycloaddition reaction according to the following Reaction Formula 3. Accordingly, a network system, in which compounds are crosslinked to each other through triazole, may be obtained.

[Reaction Formula 3]

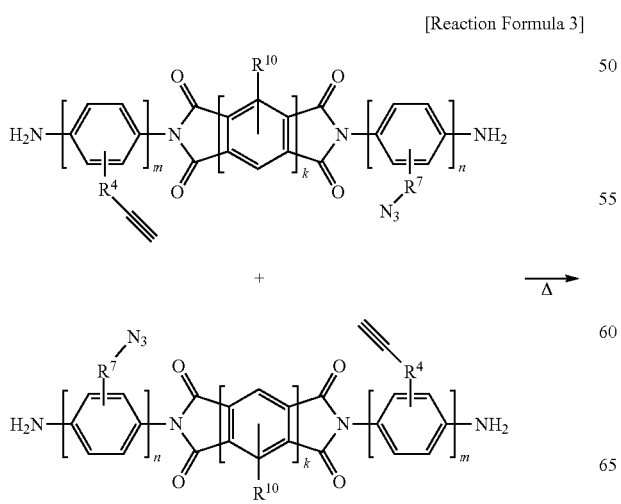

In some example embodiments, when the composition used in process P120 has the structure of Formula (4-2) including alkyne and azide, a heat treatment may be performed on the composition according to process P130 to induce a cycloaddition reaction according to the following Reaction Formula 4. Accordingly, a network system, in which compounds are crosslinked to each other through triazole, may be obtained.

[Reaction Formula 4]

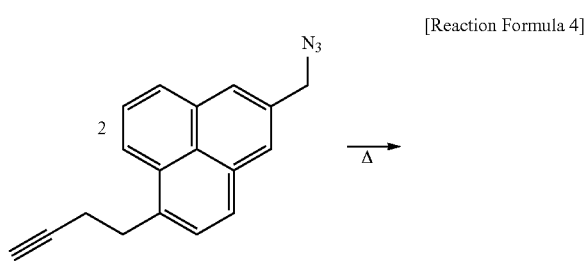

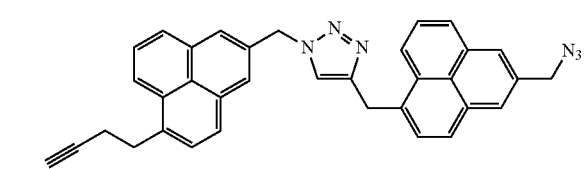

In some example embodiments, when the composition used in process P120 includes the compound having the structure of Formula (1-4) including alkyne and the compound having the structure of Formula (2-4) including azide, a heat treatment may be performed on the composition according to process P130 to induce a cycloaddition reaction according to the following Reaction Formula 5. Accordingly, a network system, in which compounds are crosslinked to each other through triazole, may be obtained.

[Reaction Formula 5]

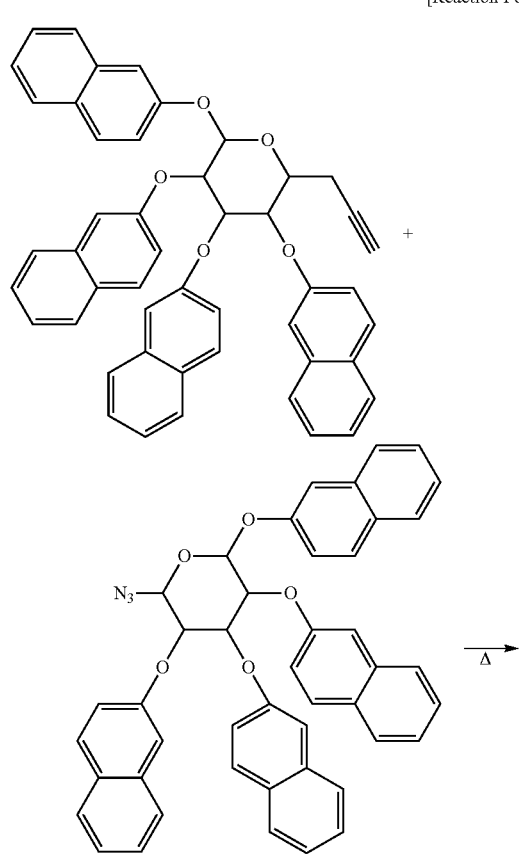

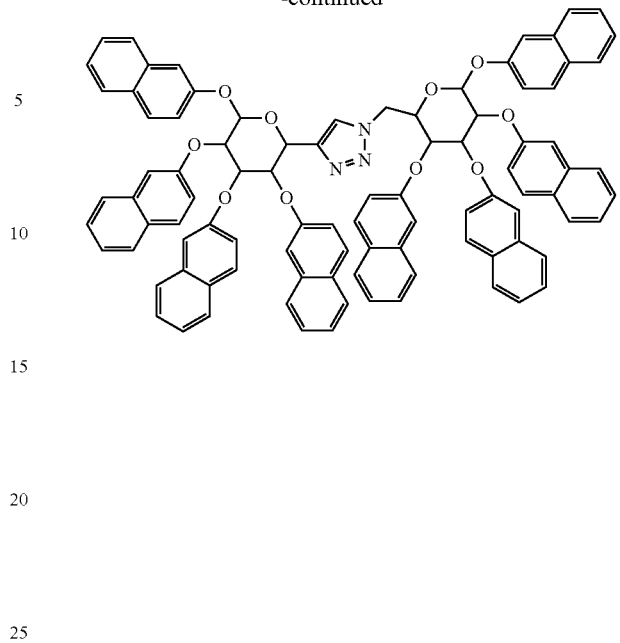

In some example embodiments, when the composition used in process P120 has the structure of Formula (4-3) including alkyne and azide, a heat treatment may be performed on the composition according to process P130 to induce a cycloaddition reaction according to the following Reaction Formula 6. Accordingly, a network system, in which compounds are crosslinked to each other through triazole, may be obtained.

[Reaction Formula 6]

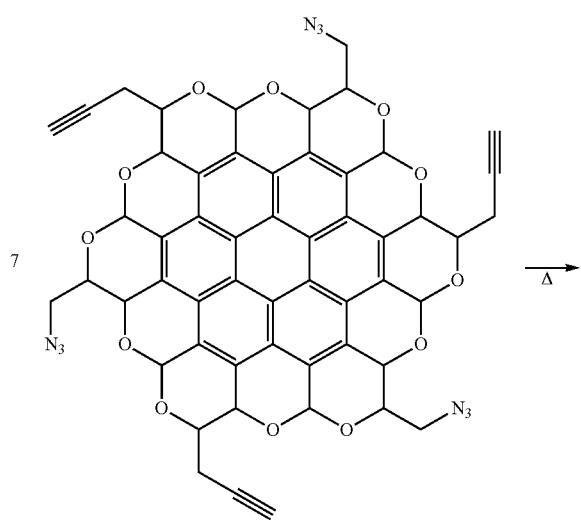

-continued

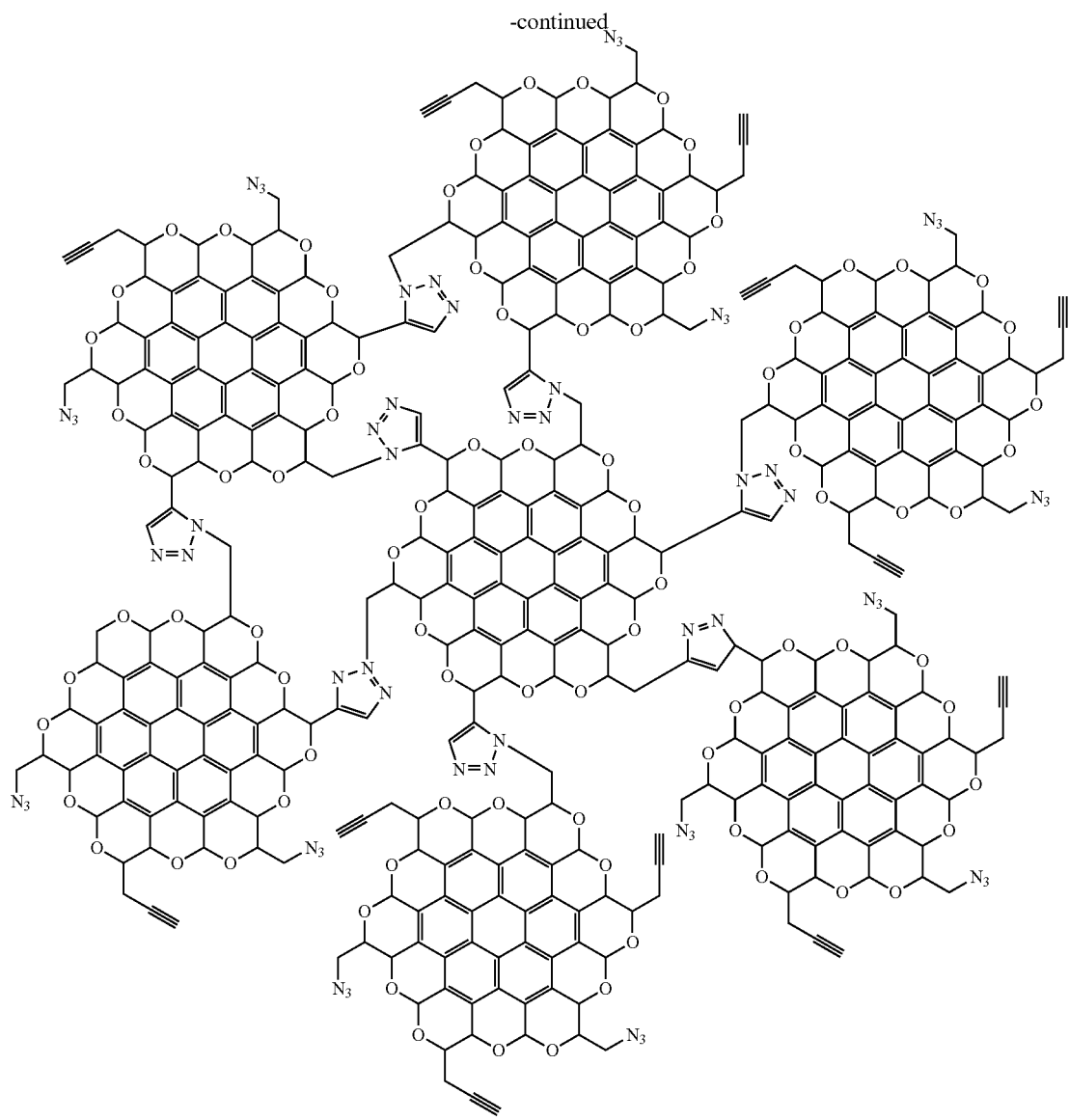

As can be seen from Reaction Formulas 1 to 6, when the carbon-containing layer is formed according to process P130 of FIG. 1, the cycloaddition reaction between alkyne and azide may be used, which is unlike the crosslinking caused by a condensation reaction (or esterification) between polymers as is typically found in a common coating layer forming process.

At the time of manufacturing a semiconductor device, in spin on hardmask (SOH) materials used as a hardmask material, notable physical properties are, for example, a gap-fill property capable of fully filling recess portions, and a planarity property capable of maintaining planarity throughout a relatively wide region so as to smoothly perform a subsequent process on a coating film, the recess portions being formed in a lower structure having a stepped structure after a composition including a relevant material is coated on the lower structure, and the coating film being formed after the coating.

It has been typically difficult for SOH materials developed up to now to satisfy the two properties, that is, the gap-fill property and the planarity property, at the same time, and accordingly, it has been necessary to develop additional equipment so as to satisfy the planarity property by overcoming material limitations of the existing SOH materials. In this case, there has been a limitation in decreasing product productivity due to an increase in process costs. As described above, there have been limitations in developing SOH materials for satisfying the gap-fill property and the planarity property at the same time and improving a process of manufacturing a semiconductor device by using the SOH materials. Accordingly, when a coating film is formed on a lower structure having a stepped portion in a process of manufacturing a highly-integrated semiconductor device, developing materials capable of satisfying the gap-fill property and the planarity property at the same time may be advantageous.

When a coating film is formed by using a composition developed and used up to now so as to manufacture a semiconductor device, the greatest difficulty in satisfying the planarity property is due to material limitations of polymers constituting the composition. When macromolecules are used as the polymers constituting the composition, it is difficult to expect the macromolecules to provide an improved gap-fill property. In order to overcome the difficulty, it may be advantageous to use polymer units having a relatively low molecular weight of about 3,000 or less, and the polymer units having the relatively low molecular weight may be crosslinked to each other through a heat treatment at a relatively high temperature to form a coating film having one macromolecular film shape. When the coating film is formed in such a manner, the condensation or esterification reaction has taken place during the crosslinking. Since small molecules such as water and methanol are separated during the condensation or esterification reaction, and some weight of the composition is lost and spaces are formed between molecules due to the separated small molecules, after the coating film is formed, a total volume of the coating film may be reduced. Accordingly, volume shrinkage is induced in many portions of a lower structure, typically resulting in degradation of an overall planarity property of the coating film.

In the composition for manufacturing the semiconductor device according to the example embodiments, when the composition is coated on a lower structure, and a heat treatment is subsequently performed on the coated composition, unlike existing materials that induce volume shrinkage due to the condensation reaction, a cycloaddition reaction (1,3-dipolar cycloaddition reaction or click reaction) between alkyne and azide may be induced to obtain the carbon-containing layer including a network system in which compounds are crosslinked to each other through triazole. As described above, since the triazole is formed by the cycloaddition reaction between compounds included in the composition, some weight of the composition may not be lost in raw compounds constituting the composition, and small molecules such as water and methanol may not be separated, thereby reducing or substantially suppressing spaces between molecules from being formed in the carbon-containing layer or a total volume of the carbon-containing layer from being shrunk. As described above, in a case where a semiconductor device is manufactured by using the composition for manufacturing the semiconductor device according to the example embodiments, even when compounds having a relatively low molecular weight are included in the composition, an improved gap-fill property may be acquired, volume shrinkage may not be induced after the heat treatment is performed on the carbon-containing layer obtained from the composition, a stable network system may be obtained, and a planarity property may be improved throughout a wide range on the substrate.

As described above, as the result of the forming of the carbon-containing layer according to process P130, even when a stepped portion exists on the feature layer that is the lower structure, after the heat treatment is performed on the coated composition so as to form the carbon-containing layer, undesired volume shrinkage may not be induced in the carbon-containing layer, degradation of the planarity due to the stepped portion of the feature layer may be prevented, and formation of undesired voids may be prevented. Therefore, the carbon-containing layer, which provides an improved gap-fill property on the feature layer and acquires an improved planarity property throughout a relatively wide region, may be formed.

Referring to FIG. 1 again, in process P140, a photoresist film may be formed on the carbon-containing layer formed according to process P130.

The photoresist film may include a resist for extreme ultraviolet (EUV) light (13.5 nm), but is not limited thereto. For example, the photoresist film may include at least one of a resist for an F2 excimer laser (157 mm), a resist for an ArF excimer laser (193 mm), and a resist for a KrF excimer laser (248 mm). The photoresist film may include at least one of a positive photoresist and a negative photoresist.

In some example embodiments, in order to form the photoresist film including positive photoresist, a photosensitive polymer including an acid-labile group and a photoresist composite including a potential acid and a solvent may be spin-coated on the feature layer.

In some example embodiments, the photosensitive polymer may include a (meth)acrylate-based polymer. The (meth)acrylate-based polymer may be an aliphatic (meth)acrylate-based polymer. Examples of the photosensitive polymer may include one of polymethylmethacrylate (PMMA), poly(t-butylmethacrylate), poly(methacrylic acid), poly(norbornylmethacrylate), a binary or ternary copolymer of repeating units of the (meth)acrylate-based polymers, and mixtures thereof. In addition, the aforementioned photosensitive polymers may be substituted with various acid-liable protecting groups. Examples of the acid-liable protecting groups may include at least one of a tert-butoxycarbonyl (t-BOC) group, a tetrahydropyranyl group, a trimethylsilyl group, a phenoxyethyl group, a cyclohexenyl group, a tert-butoxycarbonylmethyl group, a tert-butyl group, an adamantyl group, and a norbornyl group. However, the example embodiment is not limited thereto.

In some example embodiments, the potential acid may include one of a photoacid generator (PAG), a thermoacid generator (TAG), and a combination thereof. In some example embodiments, the PAG may include a material that generates an acid when exposed to any one of EUV light (1 nm to 31 nm), an F2 excimer laser (157 nm), an ArF excimer laser (193 nm), and a KrF excimer laser (248 nm). The PAG may include at least one of onium salts, halogen compounds, nitrobenzyl esters, alkylsulfonates, diazonaphthoquinones, iminosulfonates, disulfones, diazomethanes, and sulfonyloxy ketones.

In process P150, photoresist patterns may be formed by exposing and developing the photoresist film formed in process P140.

The exposing may use at least one of EUV light (1 nm to 31 nm), an F2 excimer laser (157 nm), an ArF excimer laser (193 nm), and a KrF excimer laser (248 nm), but is not limited thereto.

In process P160, the carbon-containing layer and the feature layer may be patterned by using the photoresist patterns.

In some example embodiments, in order to pattern the carbon-containing layer and the feature layer according to process P160, after carbon-containing patterns are formed by etching the carbon-containing layer using the photoresist patterns as an etching mask, feature patterns may be formed by etching the feature layer using the carbon-containing patter as an etching mask.

In some example embodiments, the carbon-containing layer formed in process P130 may be used as an anti-reflection film when the exposing is performed so as to form the photoresist patterns according to process P150. When the patterning is performed on the carbon-containing layer and the feature layer according to process P160, the carbon-containing layer and the feature layer may be etched, for example, sequentially etched by using the photoresist patterns as an etching mask.

FIGS. 2A to 2L are cross-sectional views for describing a method of manufacturing a semiconductor device, according to example embodiments.

Figure 2A:
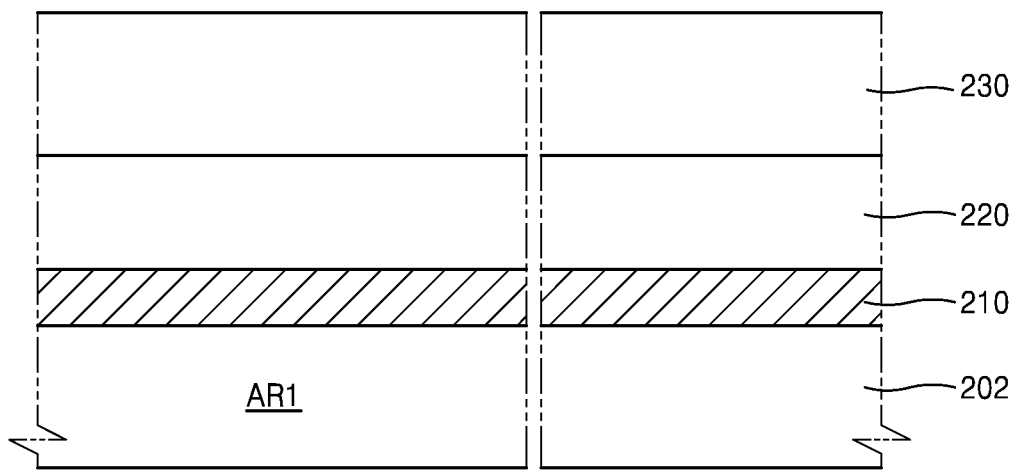
FIGS. 2A to 2L are cross-sectional views for describing a method of manufacturing a semiconductor device, according to example embodiments.

Referring to FIG. 2A, a feature layer 210 and a first hardmask layer 220 may be formed, for example, formed sequentially in this stated order on a substrate 202, and a first carbon-containing coating film 230 may be formed by coating the first hardmask layer 220 with a composition for manufacturing a semiconductor device, according to example embodiments.

The substrate 202 may include a least one of a semiconductor element such as Si or Ge and a compound semiconductor material such as SiGe, SiC, GaAs, InAs, or InP. In some example embodiments, the substrate 202 may include at least one of a Group III-V material and a Group IV material. The Group material may be a binary compound, a ternary compound, or a quaternary compound, which includes at least one Group III element and at least one Group V element. The Group III-V material may be a compound that includes at least one of indium (In), gallium (Ga), and aluminum (Al) in Group III and at least one of arsenide (As), phosphorus (P), and antimony (Sb) in Group V. Examples of the Group III-V material may include at least one of InP, $In_zGa1-zAs$ ($0 \leq z \leq 1$), and $Al_zGa1-zAs$ ($0 \leq z \leq 1$). Examples of the binary compound may include at least one of indium phosphide (InP), gallium arsenide (GaAs), indium arsenide (InAs), indium antimonide (InSb), and antimonide (GaSb). Examples of the ternary compound may include at least one of indium gallium phosphide (InGaP), indium gallium arsenide (InGaAs), aluminum indium arsenide (AlInAs), indium gallium antimonide (InGaSb), gallium arsenide antimonide (GaAsSb), and gallium arsenide phosphide (GaAsP). Examples of the Group IV material may include at least one of silicon (Si) and germanium (Ge). However, the Group III-V material and the Group IV material usable in the semiconductor device according to the example embodiments are not limited thereto. The Group III-V material and the Group IV material such as Ge may be used as a channel material capable of manufacturing a low power and high speed transistor. A high performance CMOS may be manufactured by using a semiconductor substrate including a Group III-V material, for example, GaAs having high electron mobility compared to a Si substrate, and a semiconductor substrate including a semiconductor material, for example, Ge having high hole mobility compared to the Si substrate. In another example, the substrate 202 may have a silicon on insulator (SOI) structure. The substrate 202 may include a conductive region, for example, an impurity-doped well or an impurity-doped structure. In addition, the substrate 202 may have various device isolation structures such as a shallow trench isolation (STI) structure.

The substrate 202 may include a first region AR1 in which patterns are arranged at a relatively high density and a second region AR2 in which patterns are arranged at a relatively low density.

The feature layer 210 may include various materials according to usages of patterns to be formed. In some example embodiments, the feature layer 210 may be a conductive film or an insulating film formed on the substrate 202 and may include, for example, at least one of a metal, a semiconductor, and an insulating material. When a gate electrode is formed on the substrate 202, the feature layer 210 may be a conductive layer and may include, for example, one of doped polysilicon, a metal, metal silicide, and combinations thereof. When a bit line is formed on the substrate 202, the feature layer 210 may include a metal, for example, tungsten or aluminum. When fine patterns to be finally formed are formed by etching the substrate 202, the feature layer 210 may be omitted. For example, when the method according to the example embodiments is used to define an active region in the substrate 202, the feature layer 210 may be omitted. In some example embodiments, the feature layer 210 may constitute a mask layer used to define patterns on the substrate 202 or a material layer (not illustrated), which is disposed under the feature layer 210. In some example embodiments, the feature layer 210 may include one of a silicon oxide film, a silicon nitride film, and a combination thereof. In some example embodiments, the feature layer 210 may include one of a metal, an alloy, metal carbide, metal nitride, metal oxynitride, metal oxycarbide, a semiconductor, polysilicon, oxide, nitride, oxynitride, a hydrocarbon compound, and combinations thereof but is not limited thereto.

The first hardmask layer 220 may include one of an oxide film, a nitride film, and a combination thereof. For example, the first hardmask layer 220 may include at least one of a thermal oxide film, a CVD oxide film, an undoped silicate glass (USG) film, and a high density plasma oxide (HDP) film. Alternatively, the first hardmask layer 220 may include at least one of a polysilicon film and a nitride film such as SiON, SiN, SiBN, or BN. The first hardmask layer 220 may include a material capable of providing an etch selectivity according to materials of the feature layer 210.

The first carbon-containing coating film 230 may include at least one carbon-based compound including at least one of an alkyne group and an azide group.

In order to form the first carbon-containing coating film 230, the composition for manufacturing the semiconductor device according to the example embodiments may be spin-coated on the first hardmask layer 220.

In some example embodiments, the first carbon-containing coating layer 230 may include the first compound including alkyne, as expressed by Formula (1), and the second compound including azide, as expressed by Formula (2). For example, the first compound including alkyne may include at least one of compounds that respectively have structures of Formulas (1-1), (1-2), (1-3), and (1-4). The second compound including azide may include at least one of compounds that respectively have structures of Formulas (2-1), (2-2), (2-3), and (2-4). The first carbon-containing coating film 230 may further include the third compound expressed by Formula (3) in addition to the first and second compounds.

In some example embodiments, the first carbon-containing coating film 230 may include the fourth compound including alkyne and azide, as expressed by Formula (4). For example, the fourth compound including alkyne and azide may include at least one of compounds that respectively have structures of Formulas (4-1), (4-2), (4-3), and (4-4).

Figure 2B:
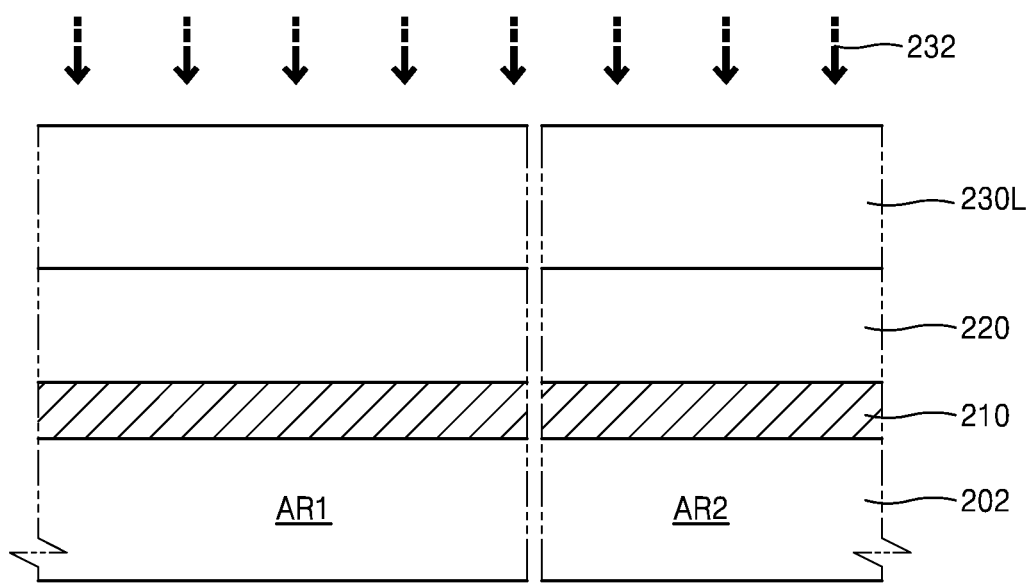

Referring to FIG. 2B, a first carbon-containing layer 230L including a triazole compound may be formed by performing a heat treatment 232 on the first carbon-containing coating film 230.

In some example embodiments, the heat treatment 232 may be performed at a temperature of about 100° C. to about 400° C., but the example embodiments are not limited thereto.

In some example embodiments, the first carbon-containing layer 230L may be formed in the same manner as described with reference to process P130 of FIG. 1.

In some example embodiments, the triazole compound included in the first carbon-containing layer 230L may be expressed by at least one of Formulas (5-1) and (5-2).

The triazole compound included in the first carbon-containing layer 230L may be a reaction product of alkyne and azide included in the at least one carbon-based compound described with reference to process P120. The first carbon-containing layer 230L may include a 1,2,3-triazole network system that includes a plurality of triazole compounds In some example embodiments, in order to form the first carbon-containing layer 230L, as in Reaction Formula 2, a cycloaddition reaction between alkyne and azide may be induced by performing a heat treatment on the first carbon-containing coating film 230 illustrated in FIG. 2A.

For example, when the first carbon-containing coating film 230 has the structure of Formula (4-1) including alkyne and azide, a cycloaddition reaction may be induced according to Reaction Formula 3 by performing a heat treatment on the first carbon-containing coating film 230. When the first carbon-containing coating film 230 has the structure of Formula (4-2) including alkyne and azide, a cycloaddition reaction may be induced in a similar or same manner as expressed by Reaction Formula 4 by performing a heat treatment on the first carbon-containing coating film 230. When the first carbon-containing coating film 230 includes the compound having the structure of Formula (1-4) including alkyne and the compound having the structure of Formula (2-4) including azide, a cycloaddition reaction may be induced according to Reaction Formula 5 by performing a heat treatment on the first carbon-containing coating film 230. When the first carbon-containing coating film 230 has the structure of Formula (4-3) including alkyne and azide, a cycloaddition reaction may be induced according to Reaction Formula 6 by performing a heat treatment on the first carbon-containing coating film 230.

The first carbon-containing layer 230L may include a film that has a relatively high carbon content of about 85 weight % to about 99 weight % with respect to a total weight of an organic compound constituting the first carbon-containing layer 230L.

Figure 2C:
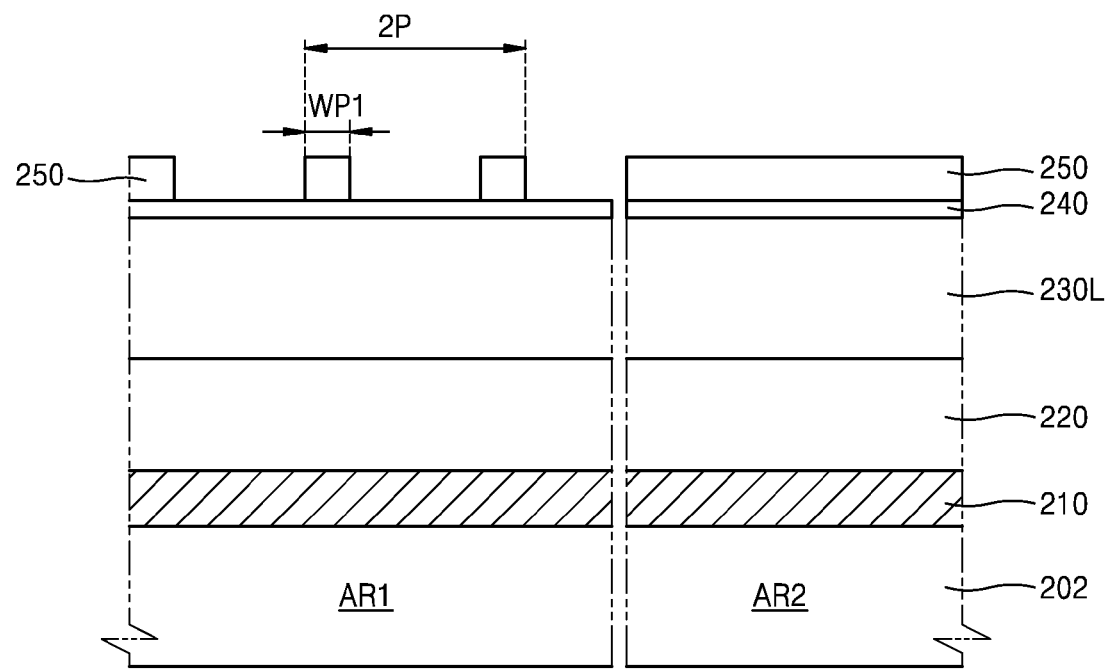

Referring to FIG. 2C, a second hardmask layer 240 may be formed on the first carbon-containing layer 230L. After a photoresist film is formed on the second hardmask layer 240, a plurality of photoresist patterns 250 may be formed in the first region AR1 so as to have a desired, or alternatively predetermined pitch by selectively patterning the photoresist film in the first region AR1.

If necessary, an organic anti-reflection film (not illustrated) may be formed between the second hardmask layer 240 and the photoresist film.

The second hardmask layer 240 may be formed through a chemical vapor deposition (CVD) process or a spin coating process. For example, the second hardmask layer 240 may include at least one of a SiON film and a spin-coated film including Si and C.

The photoresist patterns 250 may be formed so as to have a first pitch 2P that is about twice as much as a pitch P of fine patterns to be finally formed in the first region AR1. In addition, a width WP1 of the photoresist patterns 250 in the first region WP1 may be equal to or greater than a width of fine patterns to be finally formed on the substrate 202.

Figure 2D:
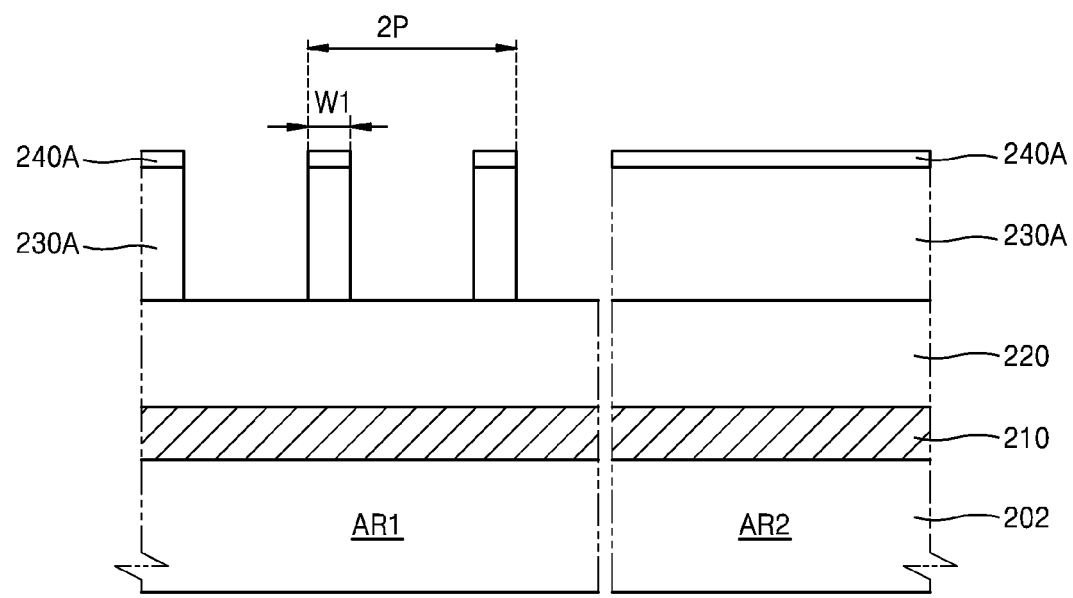

Referring to FIG. 2D, first carbon-containing patterns 230A and second hardmask patterns 240A may be formed in the first and second regions AR1 and AR2 by etching for example sequentially etching the organic anti-reflection film (not illustrated), the second hardmask layer 240, and the first carbon-containing layer 230L in the first region AR1 using the photoresist patterns 250 (see FIG. 2C) as an etching mask. An upper surface of each or one or more of the second hardmask patterns 240A may be exposed by removing the photoresist patterns 250 and unnecessary materials in the first and second regions AR1 and AR2.

The second hardmask patterns 240A are illustrated in FIG. 2D as remaining on the first carbon-containing patterns 230A, but the second hardmask patterns 240A may be removed.

In FIG. 2D, the carbon-containing patterns 230A may be formed so as to have a first pitch 2P that is about twice as much as the pitch P of the fine patterns to be finally formed. In addition, a first width of the first carbon-containing patterns 230A may be designed so as to be in a range between a value that is equal to or greater than about ¼ and a value that is less than about ½ of the first pitch 2P. The first carbon-containing patterns 230A may include, for example, a plurality of line patterns that have the first pitch 2P and are repeatedly formed in a desired, or alternatively predetermined direction on the substrate 202.

Figure 2E:
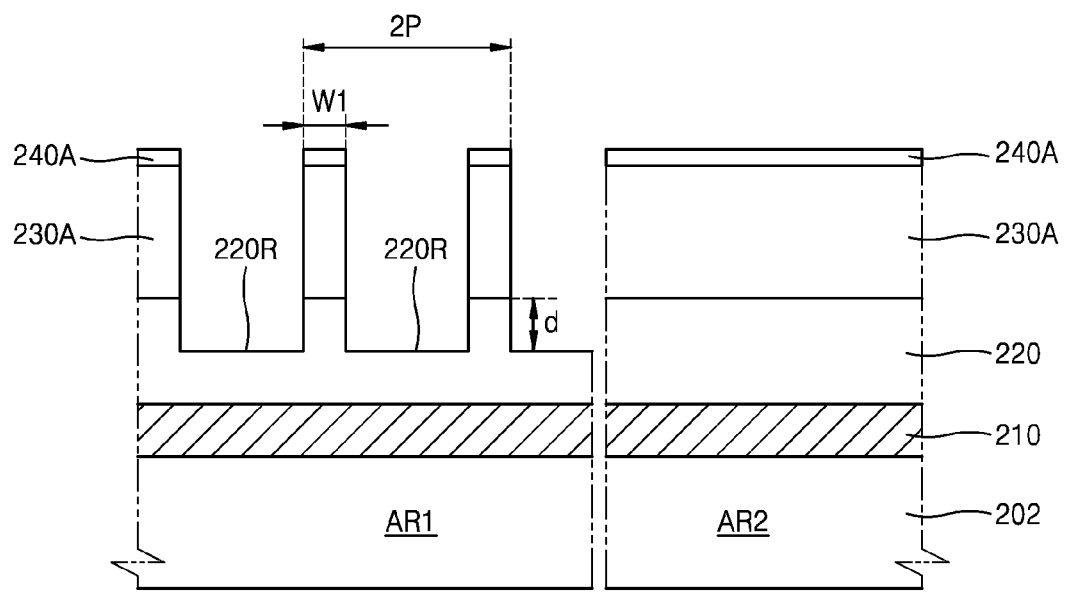

Referring to FIG. 2E, recesses 220R may be formed on the first hardmask layer 220 by removing the first hardmask layer 220 exposed between the first carbon-containing patterns 230A by a first thickness "d" from an upper surface of the first hardmask layer 220.

The first thickness "d" may be substantially the same as the first width W1 of the first carbon-containing patterns 230A. If necessary, the first thickness "d" may be less or greater than the first width W1 of the first carbon-containing patterns 230A.

A dry-etching process may be used so as to form the recesses 220R on the first hardmask layer 220. For example, during the dry-etching process of forming the first carbon-containing patterns 230A in a process of forming the first carbon-containing patterns 230A described with reference to FIG. 2D, the recesses 220R may be formed by performing, for example sequentially performing over-etching after the first carbon-containing patterns 230A are formed. Alternatively, a separate etching process may be performed to form the recesses 220R. In the example embodiment, the first hardmask layer 220 is illustrated as being formed as a single layer, but the example embodiment is not limited thereto. Although not illustrated, in order to form the recesses 220R, the first hardmask layer 220 may be formed so that a material of an upper portion in the first hardmask layer 220 is different from a material of a lower portion in the first hardmask layer 220 in terms of a total thickness of the first hardmask layer 220, the upper portion corresponding to the first thickness "d." In this case, the recesses 220R may be formed through an etching process using an etch selectivity difference between the material of the upper portion and the material of the lower portion in the first hardmask layer 220.

In some cases, a process of forming the recesses 220R, which is described with reference to FIG. 2E, may be omitted.

Figure 2F:
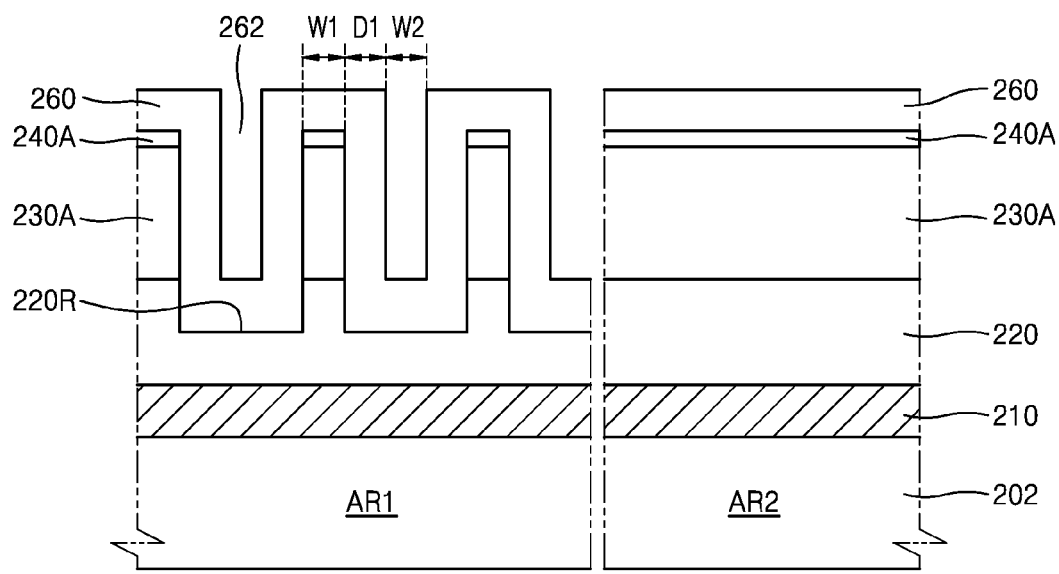

Referring to FIG. 2F, a buffer layer 260 may be formed to uniformly cover the recesses 220R on the first hardmask layer 220 and both sidewalls and an upper surface of each or one or more of the first carbon-containing patterns 230A.

When the second hardmask patterns 240A are removed and are no longer on the first carbon-containing patterns 230A, the buffer layer 260 may be formed to directly come into contact with both the sidewalk and the upper portion of each or one or more of the first carbon-containing patterns 230A.

The buffer layer 260 is illustrated in FIG. 2F as being formed to cover both the sidewalk of each or one or more of the first carbon-containing patterns 230A at a thickness D1 that is substantially equal to the first width W1 of the first carbon-containing patterns 230A. However, the example embodiment is not limited thereto. The buffer layer 260 may be formed so as to have a thickness that is substantially equal to or less than the first width W1 of the first carbon-containing patterns 230A.

The buffer layer 260 may have an upper surface that defines a narrow and deep recess space 262 having a second width W2 between two adjacent first carbon-containing patterns 230A of a plurality of first carbon-containing patterns 230A. For example, when the buffer layer 260 has a thickness D1 that is substantially equal to the first width W1 of the first carbon-containing patterns 230A, the second width W2 may be substantially equal to the first width W1. In this case, the second width W2 may have about ¼ of the first pitch 2P.

The buffer layer 260 may include an oxide film. The buffer layer 260 may be formed via, for example, an atomic layer deposition (ALD) process.

Figure 2G:
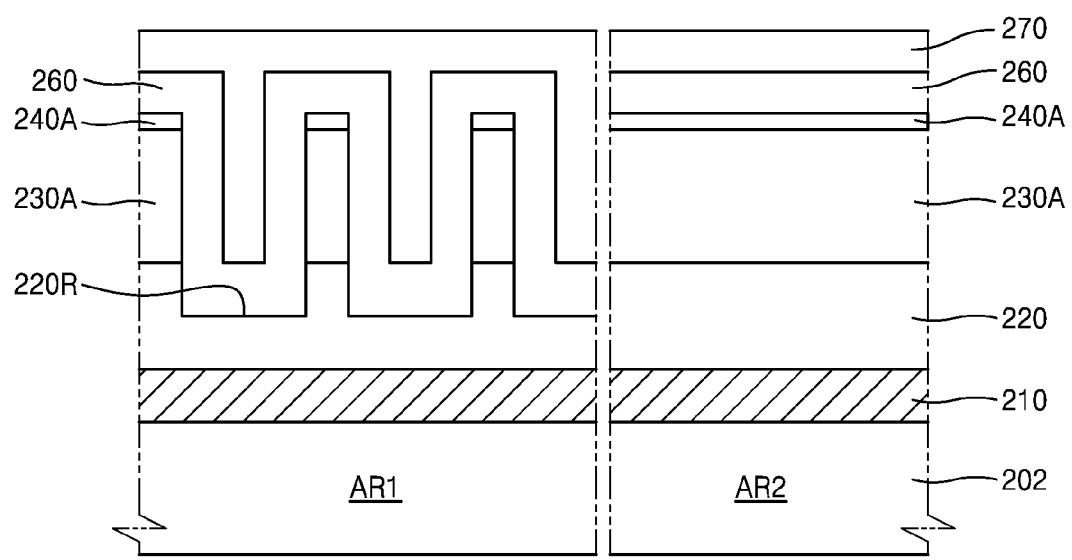

Referring to FIG. 2G, a second carbon-containing coating layer 270 may be formed on the buffer layer 260.

The second carbon-containing coating film 270 may include a carbon-based compound including at least one of an alkyne group and an azide group.

The composition for manufacturing the semiconductor device according to the example embodiments may be used so as to form the second carbon-containing coating film 270. A detailed description of the configuration and the forming of the second carbon-containing coating film 270 is substantially the same as the description of the configuration and the forming of the first carbon-containing coating film 230 provided with reference to FIG. 2A.

Figure 2H:
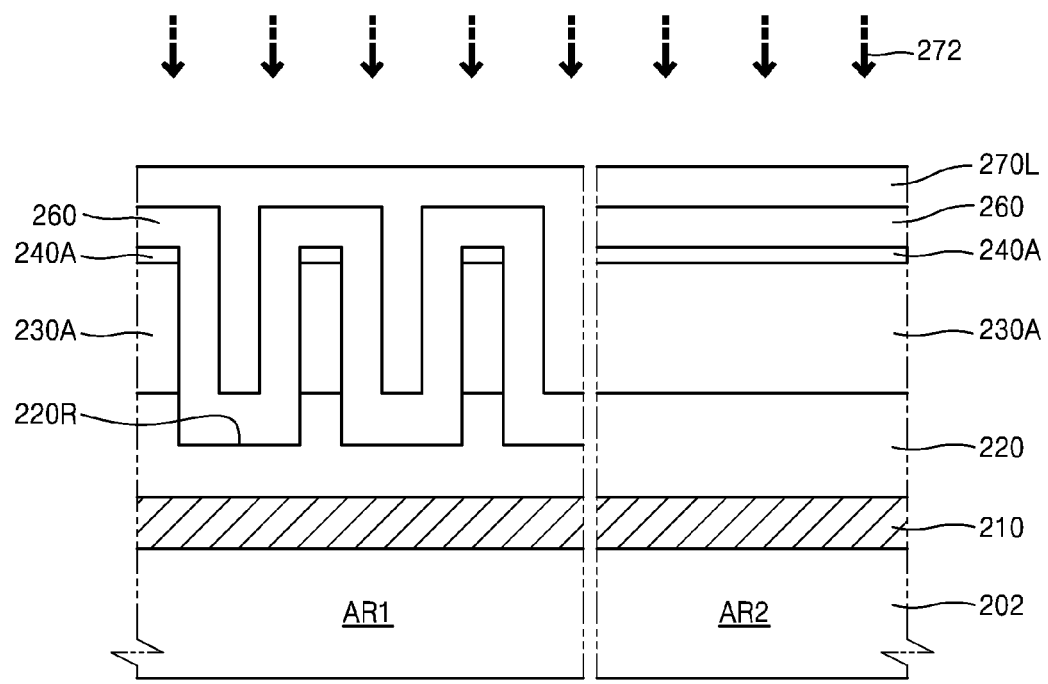

Referring to FIG. 2H, a second carbon-containing layer 270L including a triazole compound may be formed by performing a heat treatment 272 on the second carbon-containing coating film 270 (see FIG. 2G).

In some example embodiments, the heat treatment 272 may be performed at a temperature of about 100° C. to about 400° C., but the example embodiment is not limited thereto.

Since a detailed description of the forming of the second carbon-containing layer 270L is substantially the same as the description of the forming of the first carbon-containing layer 230L provided with reference to FIG. 2B, the detailed description thereof will be omitted.

In some example embodiments, a component of the second carbon-containing layer 270L may be substantially the same as a component of the first carbon-containing layer 230L. In some example embodiments, a component of the second carbon-containing layer 270L may be different from a component of the first carbon-containing layer 230L.

A lower structure, on which the second carbon-containing layer 270L is formed, may include the buffer layer 260 having an upper surface in the first region AR1, on which the narrow and deep recess space 262 is defined, and an upper surface in the second region AR2, on which a stepped portion does not exist. At the time of forming the second carbon-containing layer 270L on the buffer layer 260, when the composition according to the example embodiments is coated on the buffer layer 260, and then, a heat treatment is performed on the coated composition, unlike existing materials that induce volume shrinkage due to a condensation reaction, a cycloaddition reaction between alkyne and azide may be induced to obtain a carbon-containing layer including a network system in which compounds are crosslinked to each other through triazole. As described above, since the triazole is formed by the cycloaddition reaction between compounds included in the composition, no weight of the composition is lost in raw compounds constituting the composition, thereby reducing or substantially suppressing spaces between molecules from being formed in the second carbon-containing layer 270L and a total volume of the carbon-containing layer 270L from being shrunk. Therefore, an improved gap-fill property may be provided so as to fully fill the narrow and deep recess space 262 in the first region AR1, and an improved planarity property may also be provided by forming the second carbon-containing layer 270L having an even upper surface throughout the first and second regions AR1 and AR2.

Figure 2I:
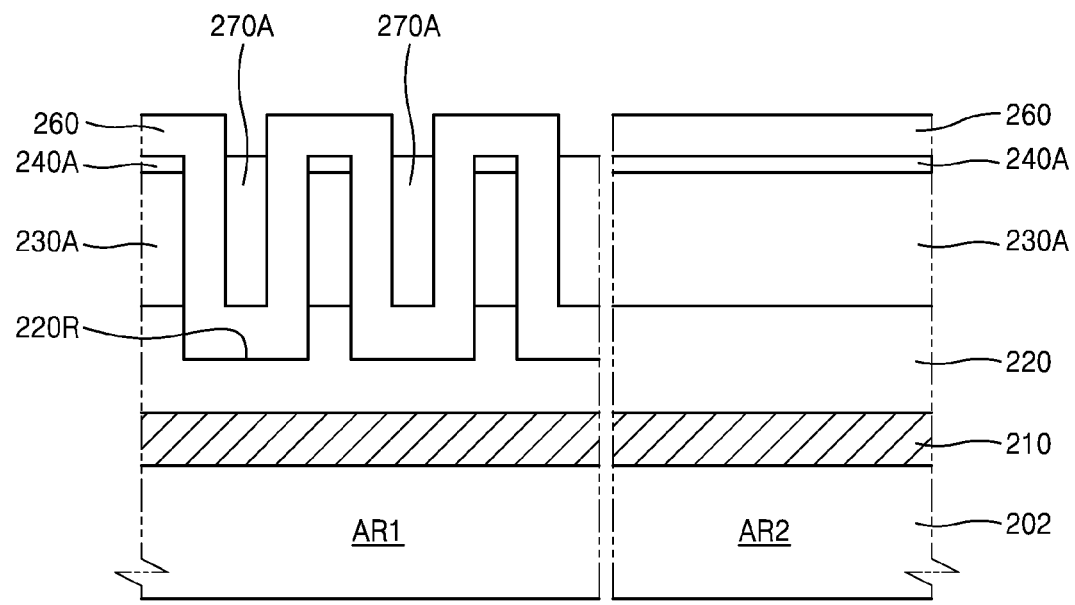

Referring to FIG. 2I, second carbon-containing patterns 270A may be formed to fill at least a portion of the recess space 262 by removing a portion of the second carbon-containing layer 270L (see FIG. 2H) until the upper surface of the buffer layer 260 is exposed. As a result, the upper surface of the buffer layer 260 may be exposed between two adjacent second carbon-containing patterns 270A of a plurality of second carbon-containing patterns 270A formed by removing one or more portions of the second carbon-containing layer 270L.

An etchback process may be used so as to remove the portion of the second carbon-containing layer 270L.

Figure 2J:
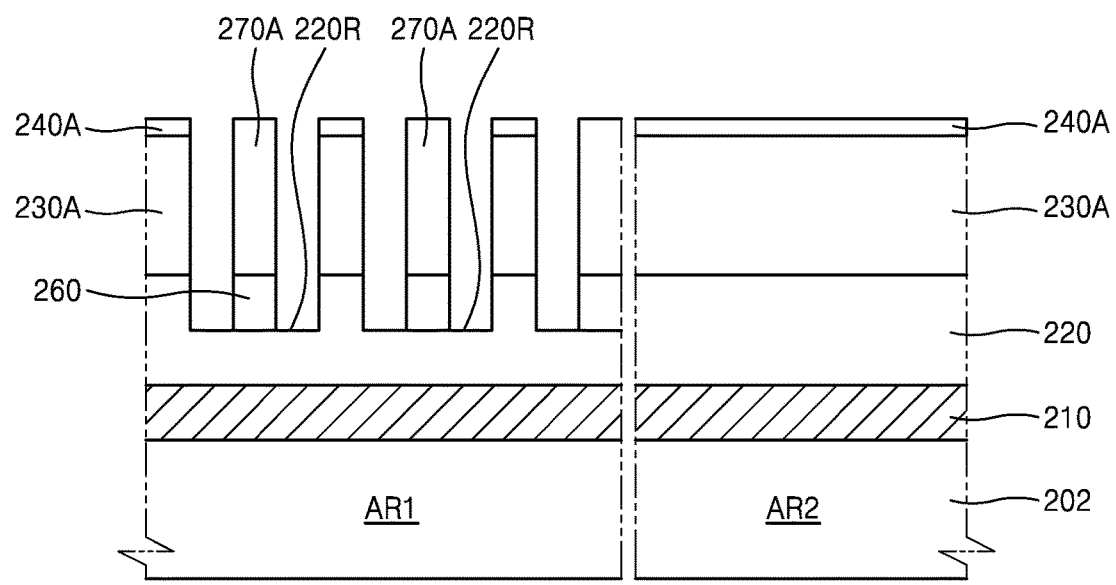

Referring to FIG. 2J, the first hardmask layer 220 may be exposed by removing a portion of the exposed buffer layer 260 in the resultant structure of FIG. 2I.

For example, a wet-etching or dry-etching process may be used so as to remove the portion of the buffer layer 260. For example, when the buffer layer 260 includes an oxide film, a fluorine-containing etchant may be used to wet-etch the buffer layer 260 at a relatively high etch selectivity with respect to the first and second carbon-containing patterns 230A and 270A. For example, the fluorine-containing etchant may include one of diluted HF (DHF), $NH_4F$, and a combination thereof. For example, the fluorine-containing etchant may include DHF obtained by mixing pure water and HF in a volume ratio of about 50:1. Alternately, when the dry-etching process is used so as to remove the portion of the buffer layer 260, a CxFy gas (where each of x and y is an integer from 1 to 10) may be used as an etching gas. Alternately, a mixture gas of CxFy and $O_2$ or a mixture gas of CxFy, $O_2$, and Ar may be used as the etching gas. Examples of the CxFy gas may include at least one of $C_3F_6$, $C_4F_6$, $C_4F_8$, and $C_5F_8$. The $O_2$ added to the etching gas may function to remove polymer by-products generated in an etching process and may function to decompose a CxFy etching gas. In addition, the Ar added to the etching gas may be used as a carrier gas and may also function to induce ion bombarding.

As described with reference to FIG. 2J, during the removing of the portion of the buffer layer 260 through the dry-etching process until the first hardmask layer 220 is exposed, each or one or more of the first and second carbon-containing patterns 230A and 270A may be consumed by a desired, or alternatively predetermined thickness from a surface thereof according to a chemical composition of an etching gas and an etching atmosphere, and after an upper surface of each or one or more of the recesses 220R on the first hardmask layer 220 is exposed, a width of each or one or more of the first carbon-containing patterns 230A and 270A may be less than the first width W1. In addition, in a case where the first hardmask layer 220 includes an oxide film, when the first hardmask layer 220 is exposed by removing the portion of the buffer layer 260, an exposed portion of the first hardmask layer 220 may be partially etched by the etching gas for etching the buffer layer 260. However, in a case where the first hardmask layer 220 includes a nitride film, even when the first hardmask layer 220 is exposed by removing the portion of the buffer layer 260, an exposed portion of the first hardmask layer 220 may be hardly etched by the etching gas for etching the buffer layer 260.

Figure 2K:
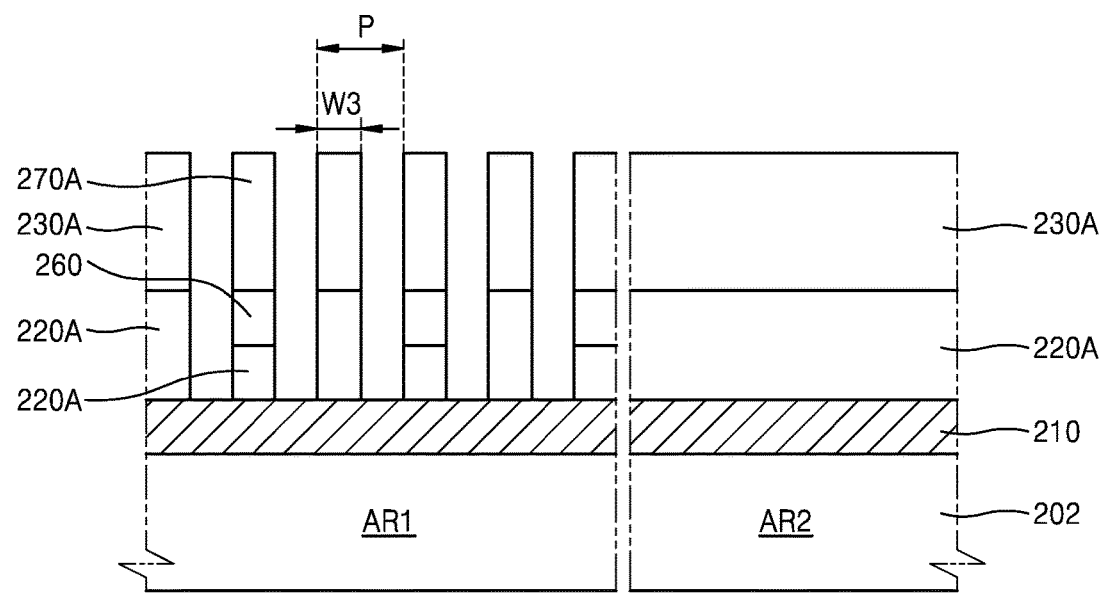

Referring to FIG. 2K, first hardmask patterns 220A may be formed by etching the first hardmask layer 220 using the first and second carbon-containing patterns 230A and 270A as an etching mask. After the first hardmask patterns 220A are formed, only the remaining portion of the first and second carbon-containing patterns 230A and 270A, which is not etched during the etching of the first hardmask layer 220, may remain on the first hardmask patterns 220A.

The first hardmask patterns 220A may have a third width W3 that is about ¼ or less of the first pitch 2P. The first hardmask patterns 220A may be formed, for example repeatedly formed, at a fine pitch P that is about ½ of the first pitch 2P.

Figure 2L:
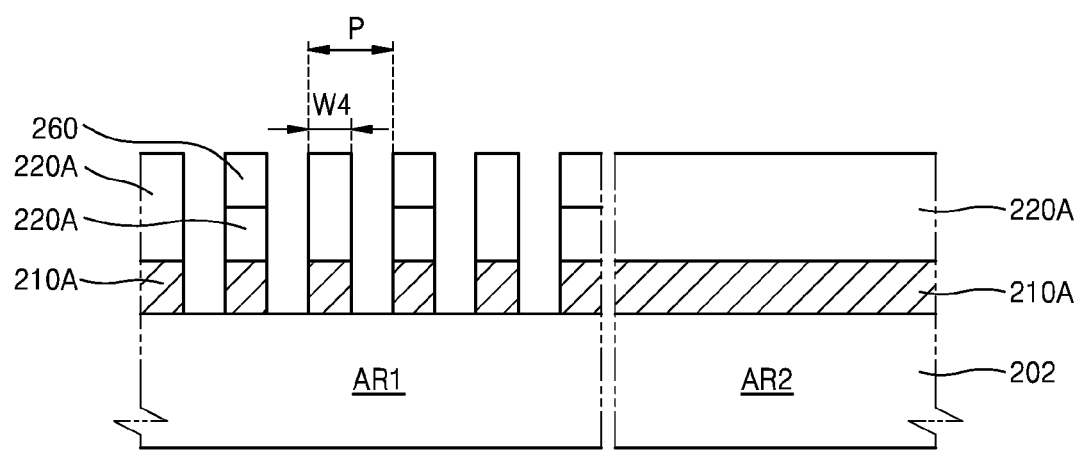

Referring to FIG. 2L, a plurality of fine patterns 210A may be formed by etching the feature layer 210 using a plurality of first hardmask patterns 220A as an etching mask At this time, before the feature layer 210 is etched, the remaining portion of the first and second carbon-containing patterns 230A and 270A, which remains on the first hardmask patterns 220A, may be removed or may not be removed to etch the feature layer 210. In addition, the buffer layer 260 remaining on the first hardmask patterns 220A may also be used as an etching mask.

The fine patterns 210A may have a fourth width W4 that is about ¼ or less of the first pitch 2P. The fine patterns 210A may be repeatedly formed at a fine pitch P that is about ½ of the first pitch 2P.

Although not illustrated, when the feature layer 210 is not formed, and the hardmask layer 220 is directly formed on the substrate 202, the fine patterns 210A may be formed on the substrate 202 by etching the substrate 202 using the plurality of first hardmask patterns 220A as an etching mask.

The example methods of manufacturing the semiconductor device, which have been described with reference to FIGS. 1 and 2A to 2L, may be used to manufacture a three-dimensional (3D) memory array. The 3D memory array may be monolithically formed in at least one physical level of memory cell arrays each including an active region disposed on a silicon substrate and a circuit formed on or in the silicon substrate as a circuit related to an operation of a memory cell. The term "monolithically" may mean that layers of each or one or more of the levels constituting the memory cell arrays are stacked directly on layers of each or one or more of the lower levels of the memory cell arrays.

In an example embodiment, the 3D memory array may include vertical NAND strings vertically disposed so that at least one memory cell is arranged on another memory cell. The at least one memory cell may include a charge trap layer.

Appropriate configurations of a 3D memory array including a plurality of levels and word lines and/or bit lines shared by the levels are disclosed in U.S. Pat. Nos. 7,679,133, 8,553,466, 8,654,587, and 8,559,235, and U.S. Patent Application Publication No. 2011/0233648, the entire contents of which are incorporated herein by reference.

Figure 3:
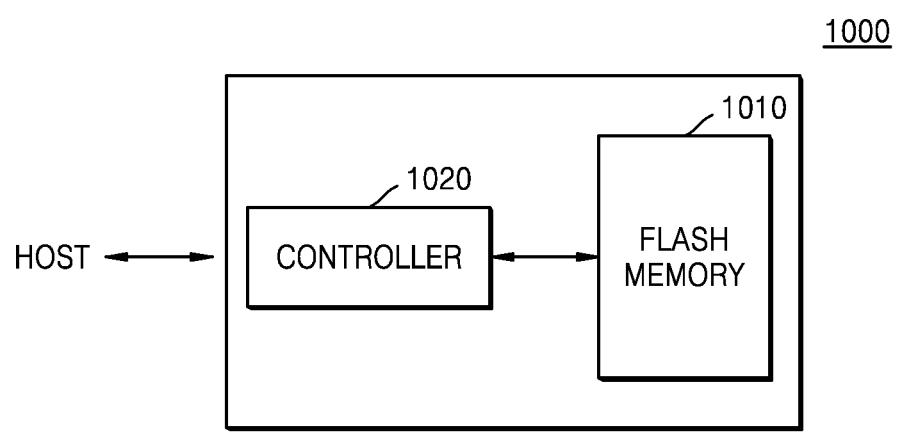
FIG. 3 is a block diagram of a memory card according to example embodiments.

FIG. 3 is a block diagram of a memory card 1000 according to example embodiments.

Referring to FIG. 3, the memory card 1000 may include a flash memory 1010 and a controller 1020.

The flash memory 1010 may store data. In some example embodiments, the flash memory 1010 may have non-volatile characteristics which are capable of retaining the stored data even when a power supply is cut off. The flash memory 1010 may include the semiconductor device manufactured by the methods described above with reference to FIGS. 1 to 2L or modifications thereof made without departing from the scope of the inventive concepts.

The controller 1020 may read the data stored in the flash memory 1010 in response to a read/write request from a host, or may store the data read from the flash memory 1010.

Figure 4:
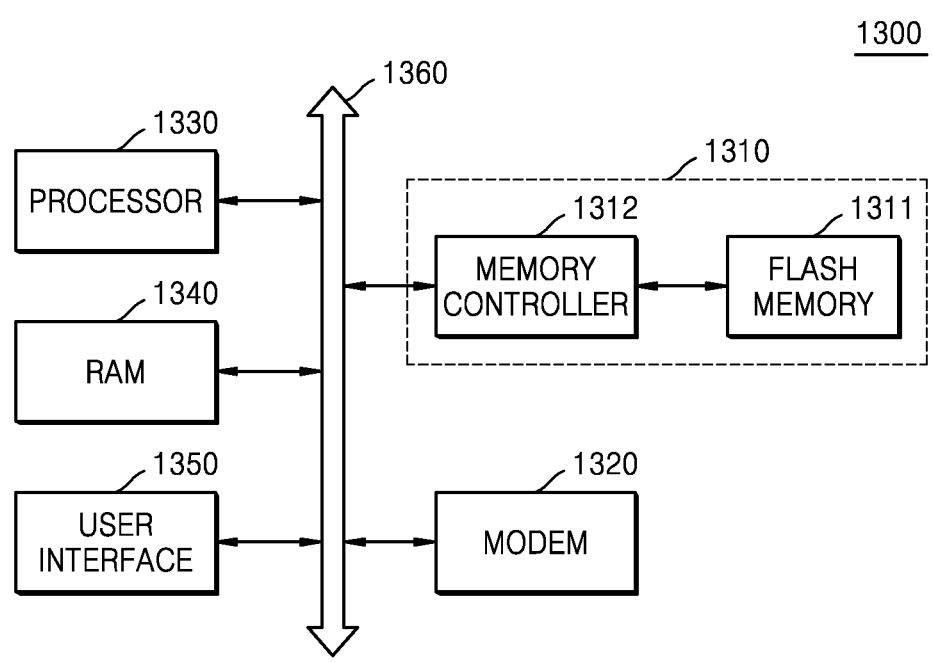
FIG. 4 is a block diagram of a memory system according to example embodiments.

FIG. 4 is a block diagram of a memory system 1300 according to example embodiments.

Referring to FIG. 4, the memory system 1300 may include a processor 1330 such as a central processing unit (CPU), a random access memory (RAM) 1340, a user interface 1350, and a modem 1320, which communicate with one another through a common bus 1360. Each or one or more of the electronic devices 1330, 1340, 1350, and 1320 may transmit or receive a signal to or from a memory card 1310 through the common bus 1360. The memory card 1310 may include a flash memory 1311 and a memory controller 1312. The flash memory 1311 may store data. In some example embodiments, the flash memory 1311 may have non-volatile characteristics which are capable of retaining the stored data even when a power supply is cut off. In the memory system 1300, at least one of the memory card 1310, the processor 1330, the RAM 1340, the user interface 1350, and the modem 1320 may include the semiconductor device manufactured by the methods described above with reference to FIGS. 1 to 2L, or modifications thereof made without departing from the scope of the inventive concepts.

The memory system 1300 may be applied to various electronic applications. For example, the memory system 1300 may be applied to solid state drivers (SSDs), CMOS image sensors (CISs), and computer application chipsets.

The memory systems and the devices described above may be packaged in any one of various device package shapes including ball grid arrays (BGAs), chip scale packages (CSPs), plastic leaded chip carriers (PLCCs), plastic dual in-line packages (PDIPs), multi-chip packages (MCPs), wafer-level fabricated packages (WFPs), and wafer-level processed stock packages (WSPs), but are not limited thereto.

Synthesis Example 1

Synthesis of Monomer (Synthesis of Polyimide)

About 1 mole of pyromellitic dianhydride (PMDA) and N-methyl-2-pyrrolidinone (NMP) were mixed in a 1,000-mL three neck distillation flask including an agitator and a nitrogen inlet, and agitation was performed until the PMDA was fully dissolved. About one gram equivalent of diamine (m=1, $R^4$ is —$CH_3$, and each of $R^5$ and $R^6$ is —$NH_2$) expressed by Formula (1-1) and about one gram equivalent of diamine (n=1, $R^7$ is —$CH_3$, and each $R^8$ and $R^9$ is —$NH_2$) expressed by Formula (2-1) were introduced into the 1,000-mL three neck distillation flask, and agitation was performed for about 24 hours to synthesize poly(amic acid). The synthesized poly(amic acid) was washed several times with ethanol/$H_2O$, and was dried an oven at a temperature of about 100° C. for about 3 hours to obtain poly(amic acid) powders. The obtained poly(amic acid) powders were fully dissolved in an NMP solvent and were agitated for 1 hour by raising a reaction temperature to a temperature of about 180° C. to about 210° C. to thereby convert the poly(amic acid) into polyimide.

Preparation Example 1

Preparation of Hardmask Composition

A hardmask composition was prepared by dissolving the polyimide obtained in synthesis example 1 in a mixture solvent of propylene glycol monomethyl ether (PGMEA) and cyclohexanone having a volume ratio of about 7:3 and filtering the PGMEA and the mixture solvent.

Preparation Example 2

Formation of Carbon-Containing Layer

A carbon-containing layer was formed by coating the hardmask composition prepared in preparation example 1 on a silicon wafer and performing a heat treatment on the coated hardmask composition at a temperature of about 200° C. for about 90 seconds to induce a cycloaddition reaction allowing alkyne and azide to be crosslinked to each other.

While the inventive concepts have been particularly shown and described with reference to example embodiments thereof, it will be understood that various changes in form and details may be made therein without departing from the spirit and scope of the following claims.

What is claimed is:

1. A composition for manufacturing a semiconductor device, the composition comprising:
    at least one carbon-based compound including at least one of an alkyne group and an azide group; and
    a solvent;
    wherein the at least one carbon-based compound comprises a first compound including alkyne and a second compound including azide.

2. The composition of claim 1, wherein the first compound is expressed by the following Formula (1):

$$R^1 \equiv R^2, \quad \text{Formula (1)}$$

wherein $R^1$ is a C1-C50 aliphatic hydrocarbon group or a C6-C50 aromatic hydrocarbon group, and $R^2$ is a hydrogen atom, a C1-C50 aliphatic hydrocarbon group, or a C6-C50 aromatic hydrocarbon group; and
   the second compound is expressed by the following Formula (2):

$$N_3 - R^3, \quad \text{Formula (2)}$$

wherein $R^3$ is a C1-C50 aliphatic hydrocarbon group or a C6-C50 aromatic hydrocarbon group.

3. The composition of claim 1, wherein the first compound is expressed by the following Formula (1-1):

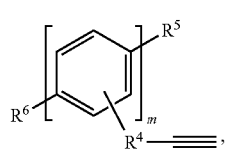

Formula (1-1)

wherein $R^4$ includes at least one of a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group, each of $R^5$ and $R^6$ independently includes a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group, a carboxyl group salt, a sulfonic acid group, a sulfonic acid group salt, a phosphoric acid, a phosphate, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring, and
   m is an integer from 1 to 10.

4. The composition of claim 1, wherein the second compound is expressed by the following Formula (2-1):

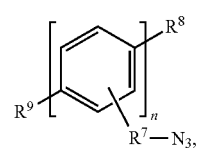

Formula (2-1)

wherein $R^7$ includes at least one of a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group,
   each of $R^8$ and $R^9$ independently includes at least one of a hydrogen atom, a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group, a carboxyl group salt, a sulfonic acid group, a sulfonic acid group salt, a phosphoric acid, a phosphate, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring, and
   n is an integer from 1 to 10.

5. The composition of claim 1, wherein the at least one carbon-based compound further comprises a third compound having a structure that is different from a structure of at least one of the first and second compounds.

6. The composition of claim 1, wherein the first compound is expressed by the following Formula (1-3):

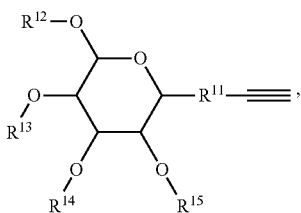

Formula (1-3)

where $R^{11}$ includes at least one of a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group, and each of $R^{12}$, $R^{13}$, $R^{14}$, and $R^{15}$ independently includes at least one of a hydrogen atom, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

7. The composition of claim 1, wherein the second compound is expressed by the following Formula (2-3):

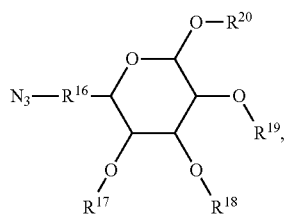

Formula (2-3)

wherein $R^{16}$ is a C1-C50 aliphatic hydrocarbon group or a C6-C50 aromatic hydrocarbon group, and each of $R^{17}$, $R^{18}$, $R^{19}$, and $R^{20}$ independently includes at least one of a hydrogen atom, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

8. A composition for manufacturing a semiconductor device, the composition comprising:
at least one carbon-based compound including at least one of an alkyne group and an azide group; and
a solvent;
wherein the at least one carbon-based compound comprises a fourth compound including alkyne and azide.

9. A composition for manufacturing a semiconductor device, the composition comprising:
at least one carbon-based compound including at least one of an alkyne group and an azide group; and
a solvent;
wherein the at least one carbon-based compound comprises a fourth compound expressed by the following Formula (4):

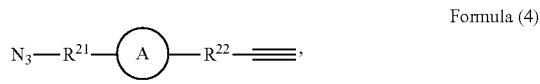

Formula (4)

wherein "A" includes a carbon-based compound including at least one substituted or unsubstituted ring,
$R^{21}$ and $R^{22}$ are substantially equal to or different from each other, and each of $R^{21}$ and $R^{22}$ independently includes at least one of a hydrogen atom, a substituted or unsubstituted C1-C20 alkyl group, a substituted or unsubstituted C1-C20 heteroalkyl group, a substituted or unsubstituted C2-C20 alkenyl group, a substituted or unsubstituted C2-C20 heteroalkenyl group, a substituted or unsubstituted C6-C30 aryl group, a substituted or unsubstituted C6-C30 heteroaryl group, a substituted or unsubstituted C2-C20 alkynyl group, and a substituted or unsubstituted C2-C20 heteroalkynyl group.

10. The composition of claim 1, wherein at least one of the first and second compounds comprises at least one heteroatom from nitrogen (N), oxygen (O), phosphorus (P), sulfur (S), boron (B), silicon (Si), a halogen atom, and a metal atom.

11. The composition of claim 5, wherein the third compound does not comprise alkyne and azide.

12. The composition of claim 5, wherein the third compound comprises pyromellitic dianhydride (PMDA).

13. The composition of claim 5, wherein the third compound comprises at least one heteroatom from nitrogen (N), oxygen (O), phosphorus (P), sulfur (S), boron (B), silicon (Si), a halogen atom, and a metal atom.

14. The composition of claim 9, wherein "A" comprises a fused aliphatic ring, a fused aromatic ring, a fused heteroaliphatic ring, or a fused heteroaromatic ring.

15. The composition of claim 9, wherein "A" comprises at least one of substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, and a cyano group.

16. The composition of claim 9, wherein "A" comprises at least one heteroatom from nitrogen (N), oxygen (O), phosphorus (P), sulfur (S), boron (B), silicon (Si), a halogen atom, and a metal atom.

17. The composition of claim 9, wherein each of $R^{21}$ and $R^{22}$ independently comprises one of a methyl group, an ethyl group, a phenyl group, a pyridinyl group, a pyrrolyl group, a thiophenyl group, a furanyl group, a biphenyl group, an iptycenyl group, a tartrate ester group, an acetylene group, an alkene group, and combinations thereof.

18. The composition of claim 9, wherein the fourth compound is expressed by the following Formula (4-1):

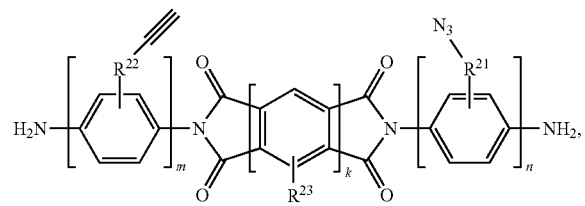

Formula (4-1)

wherein each of $R^{21}$ and $R^{22}$ independently includes one of a methyl group, an ethyl group, a phenyl group, a pyridinyl group, a pyrrolyl group, a thiophenyl group, a furanyl group, a biphenyl group, an iptycenyl group, a tartrate ester group, an acetylene group, an alkene group, and combinations thereof, $R^{23}$ includes at least one of a hydrogen atom, a C1-C50 aliphatic hydrocarbon group, and a C6-C50 aromatic hydrocarbon group, and each of k, m, and n is an integer from 1 to 10.

19. The composition of claim 9, wherein the fourth compound is expressed by the following Formula (4-2):

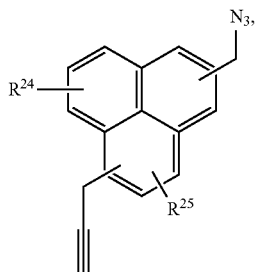

Formula (4-2)

wherein each of $R^{24}$ and $R^{25}$ independently includes at least one of a hydrogen atom, substituted or unsubstituted C1-C40 alkyl, substituted or unsubstituted C1-C40 alkoxy, substituted or unsubstituted C7-C40 aryl, substituted or unsubstituted C6-C40 aryloxy, substituted or unsubstituted C2-C40 alkenyl, substituted or unsubstituted C1-C40 alkylamino, substituted or unsubstituted C6-C40 arylamino, substituted or unsubstituted C3-C20 alkylsilyl, substituted or unsubstituted C8-C40 aryl silyl, substituted or unsubstituted C7-C40 ketoaryl, substituted or unsubstituted C7-C40 ketoheteroaryl, substituted or unsubstituted C1-C40 haloalkyl, a C1-C40 fused aliphatic ring, a fused aromatic ring, a fused heteroaliphatic ring, and a fused heteroaromatic ring.

20. The composition of claim 9, wherein the fourth compound is expressed by the following Formula (4-3):

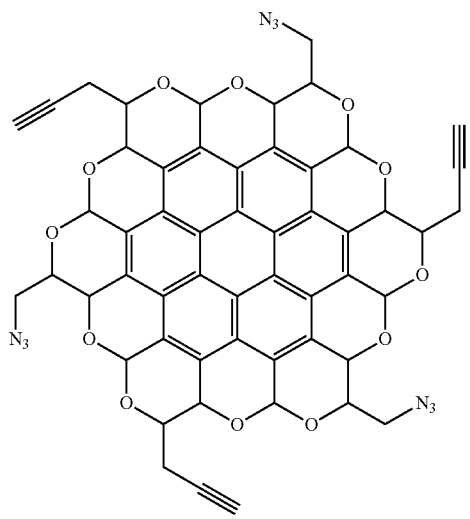

Formula (4-3)

* * * * *